US011105762B2

(12) United States Patent
Yungers et al.

(10) Patent No.: US 11,105,762 B2
(45) Date of Patent: Aug. 31, 2021

(54) VERIFYING STRUCTURAL INTEGRITY OF MATERIALS USING REFERENCE IMPEDANCE

(71) Applicant: 3M INNOVATIVE PROPERTIES COMPANY, St. Paul, MN (US)

(72) Inventors: Christopher R. Yungers, St. Paul, MN (US); Subhalakshmi M. Falknor, Woodbury, MN (US); David H. Redinger, Afton, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 161 days.

(21) Appl. No.: 16/469,955

(22) PCT Filed: Dec. 15, 2017

(86) PCT No.: PCT/US2017/066606
§ 371 (c)(1),
(2) Date: Jun. 14, 2019

(87) PCT Pub. No.: WO2018/112311
PCT Pub. Date: Jun. 21, 2018

(65) Prior Publication Data
US 2019/0383763 A1   Dec. 19, 2019

Related U.S. Application Data

(60) Provisional application No. 62/435,403, filed on Dec. 16, 2016.

(51) Int. Cl.
*G01N 27/24*   (2006.01)
*G01N 27/04*   (2006.01)
(Continued)

(52) U.S. Cl.
CPC ............ *G01N 27/24* (2013.01); *G01N 27/041* (2013.01); *G01N 27/20* (2013.01); *G01R 31/1263* (2013.01)

(58) Field of Classification Search
CPC ...... G01N 27/04; G01N 27/20; G01N 27/041; G01N 27/24; G01R 31/1263
See application file for complete search history.

(56) References Cited

U.S. PATENT DOCUMENTS

| 4,764,970 A | 8/1988 | Hayashi et al. |
| 4,785,243 A | 11/1988 | Abramczyk et al. |

(Continued)

FOREIGN PATENT DOCUMENTS

| CN | 101832970 A | 9/2010 |
| CN | 205003121 U | 1/2016 |

(Continued)

OTHER PUBLICATIONS

Anatychuk, L.I., "Procedure and Equipment for Measuring Parameters of Thermoelectric Generator Modules", Journal of Electronic Materials, vol. 40, No. 5, 2011, pp. 1292-1297.

(Continued)

*Primary Examiner* — Paresh Patel
(74) *Attorney, Agent, or Firm* — Sriram Srinivasan; Thomas M. Spielbauer

(57) ABSTRACT

A measurement system may include a set of drive electrical contacts including a force electrical contact and a return electrical contact electrically coupled to a tested material, a measurement electrical contact electrically coupled to the tested material, a return node, a voltage source, and a control module. A circuit path between the voltage source and the return node may include a fixed resistor and the tested material. The control module may be configured to cause the voltage source to apply a voltage signal to the force elec- (Continued)

trical contact, cause a voltage drop across the fixed resistor to be measured, cause a measured voltage to be measured using the measurement electrical contact, determine a measured equivalent impedance of the tested material associated with the measurement electrical contact based on the voltage drop across the fixed resistor and the measured voltage, and determine whether the tested material includes a crack or other defect based on the measured equivalent impedance.

18 Claims, 9 Drawing Sheets

(51) Int. Cl.
*G01N 27/20* (2006.01)
*G01R 31/12* (2020.01)

(56) References Cited

U.S. PATENT DOCUMENTS

| | | | |
|---|---|---|---|
| 4,914,378 | A | 4/1990 | Hayashi et al. |
| 5,258,708 | A | 11/1993 | Sadeghi et al. |
| 6,150,809 | A | 11/2000 | Tiernan et al. |
| 6,210,972 | B1 | 4/2001 | Williams et al. |
| 6,218,846 | B1 | 4/2001 | Ludwig et al. |
| 6,288,528 | B1 | 9/2001 | Goodstine et al. |
| 6,476,624 | B1 | 11/2002 | Chuman et al. |
| 6,922,641 | B2 | 7/2005 | Batzinger et al. |
| 7,161,356 | B1 | 1/2007 | Chien |
| 7,443,177 | B1 | 10/2008 | Bowler |
| 7,596,470 | B2 | 9/2009 | Kim |
| 7,705,589 | B2 | 4/2010 | Kim et al. |
| 8,327,306 | B2 | 12/2012 | Oh et al. |
| 8,552,752 | B2 | 10/2013 | Qiu |
| 8,624,401 | B2 | 1/2014 | Ishikawa |
| 8,816,705 | B2 | 8/2014 | Espejord |
| 9,037,430 | B1 | 5/2015 | Wiggins et al. |
| 2002/0024346 | A1 | 2/2002 | Ikuta et al. |
| 2002/0173926 | A1* | 11/2002 | McCord ............ G11C 7/1066 702/120 |
| 2003/0184321 | A1 | 10/2003 | Hands |
| 2004/0021461 | A1 | 2/2004 | Goldfine et al. |
| 2004/0241890 | A1 | 12/2004 | Steele et al. |
| 2005/0251062 | A1 | 11/2005 | Choi et al. |
| 2006/0283262 | A1 | 12/2006 | Smits et al. |
| 2008/0001608 | A1 | 1/2008 | Saulnier et al. |
| 2008/0191706 | A1 | 8/2008 | Burnett et al. |
| 2009/0121727 | A1 | 5/2009 | Lynch et al. |
| 2009/0192730 | A1 | 7/2009 | Tada |
| 2009/0202387 | A1 | 8/2009 | Dlugos, Jr. et al. |
| 2011/0060536 | A1 | 3/2011 | Feng |
| 2012/0013483 | A1 | 1/2012 | Jung et al. |
| 2012/0024346 | A1 | 2/2012 | Bystrom et al. |
| 2012/0153740 | A1 | 6/2012 | Soar |
| 2012/0177177 | A1 | 7/2012 | Masters |
| 2012/0235693 | A1 | 9/2012 | Feng |
| 2013/0307566 | A1 | 11/2013 | Malone et al. |
| 2014/0062521 | A1 | 3/2014 | Yamada |
| 2014/0152336 | A1 | 6/2014 | Sasaki et al. |
| 2014/0354307 | A1 | 12/2014 | Clarke et al. |
| 2015/0095000 | A1 | 4/2015 | Patil et al. |
| 2015/0204701 | A1 | 7/2015 | Klicpea |
| 2015/0308980 | A1 | 10/2015 | Bittar et al. |
| 2016/0163607 | A1 | 6/2016 | Oh et al. |
| 2017/0167927 | A1 | 6/2017 | Carkner |

FOREIGN PATENT DOCUMENTS

| | | |
|---|---|---|
| JP | S56-012544 A | 2/1981 |
| JP | S62-047544 A | 3/1987 |
| JP | H03-056848 A | 12/1991 |
| JP | H05-288706 A | 2/1993 |
| WO | WO 89/012833 A1 | 12/1989 |
| WO | WO 2007/075243 A1 | 7/2007 |

OTHER PUBLICATIONS

Aselage, T.L., et. al., "Large Enhancement of Boron Carbides' Seebeck Coefficients through Vibrational Softening" Physical Review Letters, vol. 81, No. 11, 1998, pp. 2316-2319.
Hartov, Alex, et al. "Using voltage sources as current drivers for electrical impedance tomography", Measurement Science and Technology, vol. 13, 2002, pp. 1425-1430.
International Search Report for PCT International Application No. PCT/US2017/066606, dated Mar. 15, 2018, 5 pages.
Lazarovitch, R., et al., "Experimental crack identification using electrical impedance tomography", NDT&E International, vol. 35, No. 5, pp. 301-316, Jul. 1, 2002.
Paraskevopoulous, I., "Solar Soldier: Virtual Reality Simulations and Guidelines for the Integration of Photovoltaic Technology on the Modern Infantry Soldier", School of Engineering and Design, Brunel University, U.K. 141-154.
Ruan, Tao, "Development of an Automated Impedance Tomography System and Its Implementation in Cementitious Materials", Clemson University—TigerPrints, All Dissertations Paper 1756, 2016, pp. 25-49.
Saulnier, Gary J., et al. "A high-precision voltage source for ETI", Physiological Measurement, Institute of Physics Publishing, Bristol, GB, vol. 27, No. 5, May 1, 2006, pp. S221-S236 (XP020105771).
Steinitz, Avital A. "Optimal Camera Placement." 2012 Thesis. (http://www.eecs.berkeley.edu/Pubs/TechRpts/2012/EECS-2012-69.pdf).
Valiant, Leslie G. "The Complexity of Enumeration and Reliability Problems," *SIAM Journal on Computing*, vol. 8, Issue 3, 1979, pp. 410-421.
Zaoui, Abdelhalim "Inverse Problem in Nondestructive Testing Using Arrayed Eddy Current Sensors", Sensors, 2010, vol. 10, p. 8696-8704.

* cited by examiner

VERIFYING STRUCTURAL INTEGRITY OF MATERIALS USING REFERENCE IMPEDANCE

CROSS REFERENCE TO RELATED APPLICATIONS

This application is a national stage filing under 35 U.S.C. 371 of PCT/US2017/066606, filed Dec. 15, 2017, which claims the benefit of Provisional Application No. 62/435,403, filed Dec. 16, 2016, the disclosure of which is incorporated by reference in their entirety herein.

TECHNICAL FIELD

The disclosure relates to techniques for verifying structural integrity of conductive or semiconductive materials.

BACKGROUND

Many materials are useful when their mechanical properties remain intact, but less useful when damaged, such as when cracked. Thus, detection of whether these materials are damaged is important. As one example, ceramic body plating is used to protect soldiers, police officers, and other security personnel from projectiles. Ceramic body plating may be useful when undamaged, but may be replaced after being damaged, e.g., after cracking.

X-ray scanning, including X-ray radiography and X-ray computed tomography (CT scanning) may be used to detect cracks or other defects in materials. However, such techniques may utilize large and heavy scanners, which may not be easily portable. Further, X-ray scanning and X-ray CT scanning may be relatively expensive, relatively slow, or both.

SUMMARY

In some examples, the disclosure describes a measurement system that includes a set of drive electrical contacts including a force electrical contact and a return electrical contact electrically coupled to a tested material. The measurement system also may include a measurement electrical contact electrically coupled to the tested material, a voltage source, a return node, and a control module. A circuit path between the voltage source and the return node may include a fixed resistor and the tested material. The control module may be configured to cause the voltage source to apply a voltage signal to the force electrical contact, cause a voltage drop across the fixed resistor to be measured, and cause a measured voltage to be measured using the measurement electrical contact. The control module also may be configured to determine a measured equivalent impedance of the tested material associated with the measurement electrical contact based on the voltage drop across the fixed resistor and the measured voltage, and determine whether the tested material includes a crack or other defect based on the measured equivalent impedance.

In some examples, the disclosure describes a method that includes causing, by a control module, a voltage source to apply a voltage signal to a force electrical contact of a set of drive electrical contacts. The set of drive electrical contacts may include the force electrical contact and a return electrical contact, and the force electrical contact and the return electrical contact may be electrically coupled to a tested material. A circuit path between the voltage source and the return node may include a fixed resistor and the tested material. The method also may include causing, by the control module, a voltage drop across the fixed resistor to be measured, and causing, by the control module, a measured voltage to be measured using the measurement electrical contact. The method further may include determining, by the control module, a measured equivalent impedance of the tested material associated with the measurement electrical contact based on the voltage drop across the fixed resistor and the measured voltage. The method additionally may include determining, by the control module, whether the tested material includes a crack or other defect based on the measured equivalent impedance.

The techniques described herein may provide one or more advantages. For example, using a measurement system that utilizes a voltage source to provide the electrical signal used to test the tested material may reduce cost of the measurement system compared to a measurement system that utilizes a current source, as current sources often are more expensive than voltage sources. Additionally, many microcontrollers include built-in voltage sources. Further, by measuring voltage drop across a fixed resistor between the voltage source and a return node may allow determination of a force current, allowing measurements to be compared between voltage sources or testing instances. This may facilitate use of data determined during a separate testing instance, such as control data representing an intact testing material, to determine whether the tested material includes a crack or other defect. Further, a measurement system as described herein may offer improved portability and cost compared to an X-ray radiography or X-ray computed tomography system, while offering sufficient accuracy and detail to enable detection of cracks or other defects in a material being used in the field.

The details of one or more examples are set forth in the accompanying drawings and the description below. Other features, objects, and advantages will be apparent from the description and drawings, and from the claims.

DETAILED DESCRIPTION

Figure 1:
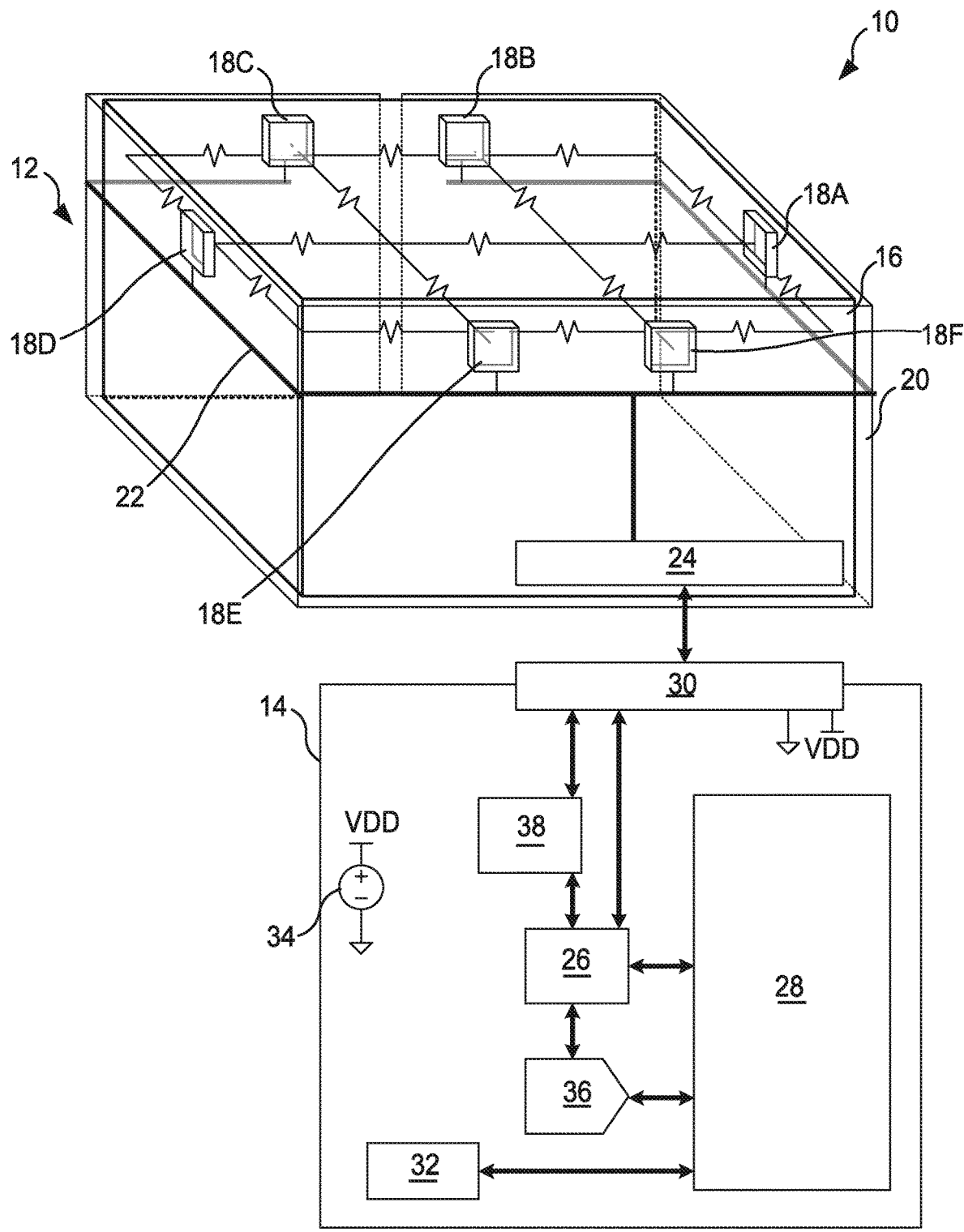
FIGS. 1 and 2 are a conceptual and schematic block diagrams illustrating example measurement systems for determining whether a tested material includes a crack or other defect.

The disclosure describes measurement systems and techniques for verifying structural integrity of a tested material, in which the measurement system determines a reference current using a fixed resistor in a circuit path between a voltage source and a return node. The tested material is also in the circuit path between the voltage source and the return node. Using a measurement system that utilizes a voltage source to provide the electrical signal used to test the tested material may reduce cost of the measurement system compared to a measurement system that utilizes a current source, as current sources often are more expensive than voltage sources. Additionally, many microcontrollers include built-in voltage sources. Further, by measuring voltage drop across a fixed resistor between the voltage source and a return node may allow determination of a force current, allowing measurements to be compared between voltage sources or testing instances. This may facilitate use of data determined during a separate testing instance, such as control data representing an intact testing material, to determine whether the tested material includes a crack or other defect.

The techniques may include determining whether the tested material includes a crack or other defect based on a comparison between at least a measured equivalent impedance associated with the material and a second equivalent impedance associated with the tested material. The second equivalent impedance may be another measured equivalent impedance or a control equivalent impedance. In some examples, the equivalent impedance may be an equivalent resistance.

For example, a control module may cause a first measured equivalent impedance to be determined by causing a voltage signal to be applied to a force electrical contact of a pair of drive electrical contacts electrically coupled to the tested material and causing a measured voltage to be determined in response to the voltage signal using a measurement electrical contact electrically coupled to the tested material. Additionally, while the voltage signal is being applied to the force electrical contact, the control module may cause a voltage drop across a fixed resistor to be determined. The fixed resistor may be in series with the voltage source, the tested material, and a return node. Using the voltage drop and the measured voltage, the control module also may determine a measured equivalent impedance associated with the measurement electrical contact.

The control module may determine whether the tested material includes a crack or other defect based on the measured equivalent impedance. For example, the control module may utilize the measured equivalent impedance and a control equivalent impedance to determine whether the material includes a crack or other defect. The control equivalent impedance may be associated with the same measurement electrical contact and have been measured at a time at which it was independently known that the tested material was intact (i.e., without a crack or other defect).

As another example, the control module may utilize the measured equivalent impedance and a second measured equivalent impedance associated with another measurement electrical contact. The positions of the contact between the first and second measurement electrical contacts and the tested material may be selected to allow meaningful comparisons between the first and second measured equivalent impedances. For example, electrical contacts may be positioned on the tested material based on a symmetry of the tested material, so that each measured equivalent impedance is substantially the same when the material is intact, or both.

Other techniques also may be used to detect cracks in a material. For example, X-ray radiography or X-ray computed tomography (CT) may be used to detect cracks in a material. However, X-ray radiography and X-ray CT utilize relatively large, relatively expensive equipment to perform the crack detection. This may prevent X-ray radiography and X-ray CT from being portable, such as being used to test materials in the environments in which they are used. Moreover, X-ray radiography and X-ray CT may be relatively time consuming. In contrast, the systems and techniques described herein utilize relatively smaller, relatively less expensive equipment.

FIG. 1 is conceptual and schematic block diagram illustrating an example measurement system 10 for determining whether a tested material 16 includes a crack or other defect. Measurement system 10 includes an article 12 and a measurement device 14. Article 12 may include tested material 16, a plurality of electrical contacts 18A-18F (collectively, "electrical contacts 18"), a substrate 20, a contact routing bus 22, and a first electrical connector 24. Measurement device 14 may include a programmable switch array (PSA) 26, a control module 28, a second electrical connector 30, a user interface 32, a voltage source 34, an analog-to-digital converter (ADC) 36, and a fixed resistor array 38.

Tested material 16 may be any material for which detection of a potential crack or other defect is desired. In some examples, tested material 16 may be an electrically conductive or an electrically semiconductive material. For example, tested material 16 may include a metal, an alloy, a metalloid, a semiconductor, an electrically conductive or semiconductive ceramic, or the like. In some examples, tested material 16 may include a ceramic such as boron carbide ($B_4C$), silicon carbide (SiC), alumina ($Al_2O_3$), composites thereof, or the like.

Tested material 16 may be used in any one of a wide variety of applications. For example, tested material 16 may be a ceramic that has relatively high hardness, a relatively high Young's modulus, a relatively high tensile strength, and may be used in ceramic armor plating. Ceramic armor plating may be used in body armor for military and police personnel, vehicle armor, or the like. Example materials for ceramic armor plating include boron carbide ($B_4C$), silicon carbide (SiC), alumina ($Al_2O_3$), composites thereof, or the like.

Tested material 16 may define any geometry, and the geometry of tested material 16 may be based at least in part on the intended use for tested material 16. For example, ceramic armor plating may have a geometry defined by the surface that the armor plating will be applied to. Example geometries for tested material 16 include, but are not limited to, polygonal solids, such as rectangular solids or solids with more sides.

In some examples, tested material 16 may define a geometry that has a symmetry, i.e., is symmetric. As used herein, a symmetry is a point, line, plane, curve, or manifold, with reference to which a single mathematical operation maps each point of tested material 16 to another point of tested material 16. As described in further detail below, in some examples in which tested material 16 includes a symmetry, control module 28 may compare voltages measured using electrical contacts 18 or pairs of electrical contacts 18 that are symmetrical with reference to the symmetry to determine whether tested material 16 includes a crack or other defect.

Article 12 also includes a plurality of electrical contacts 18. Plurality of electrical contacts 18 may include an electrically conductive material, such as, for example, an electrically conductive metal or alloy. Each of plurality of electrical contacts 18 may be electrically connected to tested material 16 using any suitable type of electrical coupling, including, for example, an electrically conductive adhesive, an electrically conductive solder, embedding electrical contacts 18 in tested material 16, a dielectric coupling via capacitive coupling, or the like.

In examples in which tested material 16 includes plurality of electrical contacts 18, each respective electrical contact may be positioned at a selected location of tested material 16. Electrical contacts 18 may be attached to any surface of tested material 16.

The surface to which material electrical contacts 18 are attached may affect the direction in which the electrical field extends and current flows within tested material 16 (e.g., when selected sets of electrical contacts 18 are used as drive electrical contacts). Cracks or other defects may affect the magnitude of the voltage more significantly when the electrical field and current flow extends across a plane of the crack (e.g., normal to a surface of the crack). As such, in some examples, the likely locations of cracks or other defects and the likely orientation of cracks or other defects within tested material 16 may be predicted based on the use for tested material 16. In some of these examples, electrical contacts 18 may then be attached to tested material 16 so that the electrical field and current flow within tested material 16 extends substantially normal to a predicted orientation of the crack or other defect.

In some examples, rather than predicting a location of the crack or other defect within tested material 16 and placing electrical contacts 18 based on the prediction, electrical contacts 18 may be attached to more than one surface of tested material 16. For example, if tested material 16 is in the shape of a cube or polygonal solid, electrical contacts 18 may be attached to surfaces that define a selected perimeter of the cube or polygonal solid, as shown in FIG. 1. Other examples are possible for other shapes. In some examples, electrical contacts 18 are distributed across a surface area of tested material 16. In other examples, electrical contacts 18 are distributed around a perimeter of tested material 16, as shown in FIG. 1. In some examples, plurality of electrical contacts 18 may be referred to as a set of N electrical contacts 18.

In some examples, electrical contacts 18 may be positioned on tested material 16 according to a selected geometric relationship, to achieve a selected relationship between voltages determined using electrical contacts 18, or both. For example, electrical contacts 18 may be positioned on tested material 16 so that each electrical contact of electrical contacts 18 is substantially symmetric to another one of electrical contacts 18 with reference to the symmetry of tested material 16. In the example of FIG. 1, first electrical contact 18A is substantially symmetric to fourth electrical contact 18D with reference to a plane of symmetry of tested material 16, second electrical contact 18B is substantially symmetric to third electrical contact 18C with reference to the plane of symmetry, and fifth electrical contact 18E is substantially symmetric to sixth electrical contact 18F with reference to the plane of symmetry.

As another example, electrical contacts 18 may be positioned on tested material 16 so that a respective pair of electrical contacts is substantially symmetric to another respective pair of material electrical contacts 18 with reference to the symmetry of tested material 16. In some examples, electrical contacts 18 may be positioned on tested material 16 so that each respective pair of electrical contacts is substantially symmetric to another respective pair of electrical contacts 18 with reference to the symmetry of tested material 16. This may be accomplished in examples in which each electrical contact of material electrical contacts 18 is substantially symmetric to another one of electrical contacts 18 with reference to the symmetry of tested material 16, and a respective electrical contact of two symmetric material electrical contacts is used in each respective pair of electrical contacts in a symmetric pair of electrical contacts.

In some examples, two material electrical contacts may be positioned on the symmetry of tested material 16, e.g., on a plane of symmetry of tested material 16 shown in FIG. 1.

Positioning electrical contacts 18 to be exactly symmetrical may be difficult to achieve in practice. Hence, electrical contacts 18 may be positioned to be substantially symmetrical. As used here, substantially symmetrical means that the electrical contacts 18 are placed approximately symmetrical with reference to a symmetry of tested material 16, e.g., within about 0.5 mm of being symmetric, within about 0.2 mm of being symmetric, or within about 0.1 mm of being symmetric.

In some examples, rather than electrical contacts 18 being positioned based on symmetry of tested material 16, electrical contacts 18 may be positioned to achieve a selected relationship between voltages determined using electrical contacts 18. For example, electrical contacts 18 may be positioned to achieve measurement of a substantially similar voltage (e.g., the same or nearly the same voltage) in the absence of a crack or other defect. In some examples, this may include positioning respective groups of electrical contacts 18 to achieve measurement of a substantially similar voltage (e.g., the same or nearly the same voltage) in the absence of a crack or other defect. Each respective group of electrical contacts 18 may include a pair of drive electrical contacts and one or two measurement electrical contacts. For example, a group of electrical contacts 18 may include a pair of drive electrical contacts separated by one or two measurement electrical contacts. Using electrical contacts 18 shown in FIG. 1, an example of this configuration may include a pair of drive electrical contacts that includes first electrical contact 18A and fourth electrical contact 18D, and a pair of measurement electrical contacts that includes second electrical contact 18B and material electrical contact 18C. Another example of this configuration may include a pair of drive electrical contacts that includes first electrical contact 18A and third electrical contact 18C, and a measurement electrical contact that includes second electrical contact 18B (to measure a single-ended voltage using second electrical contact 18B and a reference electrode (not shown in FIG. 1)).

In some examples, positioning electrical contacts 18 so that the voltage measured using each respective group of electrical contacts 18 is exactly the same as the voltage measured using each other respective group of electrical contacts 18 may be difficult to achieve in practice. Hence, electrical contacts 18 may be positioned such that the voltage measured using each respective group of electrical contacts 18 is substantially the same as the voltage measured using each other respective group of electrical contacts 18. As used herein, substantially the same means that the electrical contacts are placed so that the voltage measured using each respective group of electrical contacts is within a threshold amount as the voltage measured using each other respective group of electrical contacts in the absence of a crack or defect in tested material 16. The threshold amount may be a predetermined percentage of the measured voltage, such as, for example, 20%, 10%, 5%, or 1%.

In some examples, electrical contacts 18 may be positioned on tested material 16 to satisfy both symmetry and substantially equal measured voltages.

Article 12 also may optionally include a substrate 20. Substrate 20 may include a flex circuit, a printed circuit board (PCB), or the like, to which electronic and electrical components may be mounted and electrically connected. For example, substrate 20 may include an electrically insulating material that provides mechanical support for substrate 20 and a plurality of electrically conductive traces that electrically connect components mounted or connected to substrate 20. The electrically insulating material may include, for example, a polymer, ceramic, or other dielectric material. For instance a flex circuit may include a flexible plastic, such as a polyimide, a polyester, a polyether ether ketone (PEEK), or the like. A PCB may include, for example, a glass epoxy, a phenolic material, a polyimide, a polyester, or the like. In some examples, the PCB may include a reinforcement material, such as paper, fiberglass, or the like, impregnated or coated with a glass epoxy, a phenolic material, a polyimide, a polyester, or the like. The conductive traces in the PCB or flex circuit may include, for example, copper, silver, aluminum, or the like.

Article 12 further may include first electrical connector 24. First electrical connector 24 provides electrical connection between article 12 and measurement device 14, e.g., via connection to second electrical connector 30. As such, first electrical connector 24 and second electrical connector 30 may conform to the same connector configuration and have complementary electrical and mechanical connections. First electrical connector 24 may be physically mounted to substrate 20 and electrically connected to one or more electrically conductive traces in or on substrate 20. In some examples, first electrical connector 24 is configured to support digital signals for communication between article 12 and measurement device 14. In other examples, first electrical connector 24 is configured to support analog signals for communication between article 12 and measurement device 14.

Article 12 also may include a contact routing bus 22, which electrically connects respective electrical contacts of electrical contacts 18 to first electrical connector 24. Contact routing bus 22 may be formed by electrical traces on or in substrate 20.

Measurement device 14 may include second electrical connector 30. Second electrical connector 30 provides electrical connection between article 12 and measurement device 14, e.g., via connection to first electrical connector 24. As such, first electrical connector 24 and second electrical connector 30 may conform to the same connector configuration and have complementary electrical and mechanical connections. Second electrical connector 30 may be physically mounted to a substrate (e.g., a PCB) and electrically connected to one or more electrically conductive traces in or on the substrate. In some examples, second electrical connector 30 is configured to support digital signals for communication between article 12 and measurement device 14. In other examples, second electrical connector 30 is configured to support analog signals for communication between article 12 and measurement device 14.

Measurement device 14 additionally may include a PSA 26. PSA 26 includes a plurality of inputs and a plurality of outputs, with respective inputs electrically connected to each respective output by a network of programmable switches. For example, PSA 26 may include inputs electrically connected to respective resistors of fixed resistor array 38, and outputs electrically connected to ADC 36. Additionally, PSA 26 may be connected to control module 28, which may control positions of switches in PSA 26. In some examples, PSA 26 may include at least as many inputs as there are electrical contacts 18. For example, in the example shown in FIG. 1, article 12 includes six electrical contacts 18, and PSA 26 thus may include at least six inputs.

In some implementations, PSA 26 may include multiple inputs for each electrical contact of electrical contacts 18. For example, PSA 26 may include a respective input electrically connected to each resistor of fixed resistor array 38. Each resistor of fixed resistor array 38 also may be connected to a respective electrical contact of electrical contacts 18 via first and second connectors 24 and 30 and contact routing bus 22. In this way, each electrical contact of electrical contacts 18 may be electrically connected to a respective input of PSA 26 via a respective resistor of fixed resistor array 38. PSA 26 also may include, for each electrical contact of electrical contacts 18, a respective input that bypasses fixed resistor array 38, electrically connecting a respective electrical contact of electrical contacts 18 to a respective input of PSA 26 directly, without including an intervening resistor. Hence, in some examples, PSA 26 may include 2*N inputs, where N is the number of electrical contacts 18. By including additional inputs, PSA 26 may allow control module 28 to control PSA 26 to form circuit loops to allow determination of voltage drops across circuit elements in system 10, including, for example, switches in PSA 26, fixed resistors in fixed resistor array 38, tested material 16, or the like.

In some examples, rather than including a single PSA 26, measurement device 14 may include multiple PSAs, such as a respective PSA for each electrical contact of electrical contacts 18.

Measurement device 14 also includes a voltage source 34. Voltage source 34 may provide electrical power for operation of measurement system 10, e.g., for operation of control module 28, and the electrical signal applied to a pair of drive electrical contacts from electrical contacts 18 during testing. Voltage source 34 may include any device configured to output an electrical signal. The electrical signal may include an alternating current (AC) signal or a direct current (DC) signal. In some examples, voltage source 34 may include a power source, such as a battery, a capacitor, a supercapacitor, a transformer electrically connected to a mains voltage, or the like. In some examples, in addition to the power source, voltage source 34 may include analog or digital circuitry configured to receive the electrical signal from the power source and modify the electrical signal into a format suitable for output to components of measurement system 10.

Measurement device 14 further includes a user interface (UI) device 32. UI device 32 may include an output device, and input device, or both. Input devices may include, for example, buttons, switches, a touchscreen, or the like. Output devices may include, for example, a light or light emitting diode (LED), a display, a speaker, a haptic device, or another device configured to output visible, audible, or perceivable information.

Measurement device 14 also may include ADC 36. ADC 36 may include at least a control input electrically connected to control module 28, which allows control module 28 to control operation of ADC 36 and read data from ADC 36, and at least one signal input electrically connected to PSA 26. ADC also may include reference voltage inputs. In some examples, a positive reference voltage input may be connected to VDD (the positive output voltage of voltage source 34, which may be a power supply of measurement system 14 or an integrated circuit that includes one or more of control module 28, ADC 36, and PSA 26) and a negative reference voltage input may be connected to ground. VDD may be the positive output voltage of voltage source 34, which may be a power supply of measurement system 14 or an integrated circuit that includes one or more of control module 28, ADC 36, and PSA 26. In other examples, the positive reference voltage input may be connected to an output of a first digital-to-analog converter (DAC) and the negative reference voltage input may be connected to an output of a second DAC. Control module 28 may control the first and second DACs to output signals with selected voltages, which may affect the resolution of the ADC.

In some examples, ADC 36 may be a differential ADC, which accepts two input signals and digitizes the voltage difference between the two input signals.

Measurement device 14 also may include a fixed resistor array 38. Fixed resistor array 38 may include a plurality of resistors, e.g., one resistor for each of electrical contacts 18. Each fixed resistor of fixed resistor array 38 may have a selected value. In some examples, each fixed resistor is a precision resistor, meaning that each resistor has a tolerance of ±1% or less (e.g., an actual resistance of value within 1% or less of its nominal resistance value). In some examples, each resistor may have a tolerance of ±0.5%, ±0.25%, ±0.10%, ±0.05%, or the like. Each fixed resistor of fixed resistor array 38 may be electrically connected in series between voltage source 34 and a return node (e.g., ground) and in series with a respective electrical contact of electrical contacts 18. As described in further detail below, control module 28 may determine a voltage drop across the fixed resistor that is electrically connected in series between voltage source 34 and a selected force electrical contact from electrical contacts 18, or that is electrically connected in series between a selected return electrical contact from electrical contacts 18 and the return node. Control module 28 may utilize this voltage drop to scale measured voltages associated with tested material 14, or may utilize this voltage drop to determine equivalent impedances associated with tested material 14.

Measurement device 14 also may include a control module 28. Control module 28 is configured to control operation of measurement system 10, including PSA 26, ADC 36, UI device 32, and voltage source 34. Control module 28 may include or be implemented in, for example, a processor. The processor may include one or more microprocessors, digital signal processors (DSP), application specific integrated circuits (ASIC), field programmable gate arrays (FPGA), or other digital logic circuitry. In some examples, a microprocessor may include at least one of PSA 26, control module 28, voltage source 34, or ADC 36.

Control module 28 may be configured to control PSA 26 to electrically connect selected electrical contacts of electrical contacts 18 to serve as a pair of drive electrical contacts, i.e., a force electrical contact and a return electrical contact, such that voltage source 34 output a voltage signal to the pair of drive electrical contacts.

Control module 28 is also configured to cause PSA 26 to connect a selected electrical contact 18 to ADC 36 to serve as a measurement electrical contact. In this way, Control module 28 may determine a voltage associated with a measurement electrical contact in response to the electrical signal output to the pair of drive electrical contacts.

In some examples, control module 28 may use the single-ended voltages in the techniques described herein to determine whether tested material 16 includes a crack or other defect. In other examples, control module 28 may determine differential voltages between two electrical contacts electrically coupled to tested material 16 by comparing (e.g., subtracting) single ended voltages associated with the two electrical contacts, and control module 28 may use these differential voltages in the techniques described herein to determine whether material 16 includes a crack or other defect. In still other examples, control module 28 may determine a voltage between two of electrical contacts 18 directly, e.g., without first determining two single-ended voltages.

To determine one or more voltages to be used to determine whether tested material 16 includes a crack or other defect, control module 18 is configured to cause PSA 26 to connect a pair of electrical contacts from electrical contacts 18 to voltage source 34 (which may be part of control module 28) to act as a set of drive electrical contacts. For example, control module 28 may cause PSA 26 to connect a first electrical contact of electrical contacts 18 to a positive terminal of voltage source 34 as a force electrical contact and may cause PSA 26 to connect a second electrical contact of electrical contacts 18 to a negative terminal of voltage source 34 or ground as a return electrical contact. Control module 28 may cause voltage source 34 to output the voltage signal to the set of drive electrical contacts (e.g., to the force electrical contact). As electrical contacts 18 are electrically coupled to tested material 16, the output voltage signal may pass through the set of drive electrical contacts and through tested material 16.

As a fixed resistor of fixed resistor array 38 is connected in series between PSA 26 and the force electrical contact, between PSA 26 and the return electrical contact, or both, the voltage signal conducts through the fixed resistor. Control module 28 may control PSA 26 to create a series circuit including voltage source 34, PSA 26, and a fixed resistor of fixed resistor array 38, allowing ADC 36 to measure a voltage at the fixed resistor. By utilizing the fixed resistor voltage and another voltage, e.g., a voltage at the force electrical contact in examples in which the fixed resistor is between the force electrical contact and PSA 26 or a voltage at the return electrical contact in examples in which the fixed resistor is between the return electrical contact and PSA 26, control module 28 may determine a voltage drop across the fixed resistor. In some examples, control module 28 may determine a force current through the fixed resistor based on the voltage drop across the fixed resistor and the resistance of the fixed resistor.

Control module 28 may be configured to also cause PSA 26 to connect ADC 36 to an electrical contact of electrical contacts 18 as a measurement electrical contact, and may determine a measured voltage in response to the voltage signal applied to the pair of drive electrical contacts using the measurement electrical contact. As electrical contacts 18 are electrically coupled to tested material 16, electrical contacts 18 may be used to determine a voltage in tested material 16.

In some examples, control module 28 may be configured to cause PSA 26 to sequentially connect respective measurement electrical contacts to ADC 36, and ADC 36 may determine a respective measured voltage in response to the electrical signal using each of the respective measurement electrical contacts. Control module 28 may repeat this process of causing a voltage signal to be applied to a set of drive electrical contacts, determining a voltage drop across a fixed resistor of fixed resistor array 38 associated with one or both of the drive electrical contacts, and determining at least one respective measured voltage for any selected number of measurement electrical contacts for each set of drive electrical contacts, and for any selected number of drive electrical contacts.

Once control module 28 has received at least one measured voltage associated with a respective measurement electrical contact from ADC 36, control module 28 may utilize the measured voltage in combination with the voltage drop across the fixed resistor associated with the measured voltage to determine an equivalent impedance associated with the respective measurement electrical contact for the pair of drive electrodes across which voltage source 34 applied the voltage signal. In some examples, control module 28 may determine the equivalent impedance by first determining a force current through the fixed resistor based on the resistance of the resistor, then using the measured voltage and the force current to determine the equivalent impedance associated with the measurement electrical contact. In some examples, the measurement electrical contact may be different from the pair of drive electrical contacts, meaning that the measured voltage was measured using a four-point voltage measurement, which reduces or substantially eliminates the effect of contact resistance between the measurement electrical contact and tested material 16 and resistance of electrical connections between the measurement electrical contact and ADC 36.

Control module 28 then may determine whether tested material 16 includes a crack or other defect based on the measured equivalent impedance (or multiple measured equivalent impedances associated with multiple measurement electrical contacts). In some examples, control module may utilize the measured equivalent impedance with a control equivalent impedance associated with the same measurement electrical contact, another measured equivalent impedance associated with another measurement electrical contact from electrical contacts 18, or both to determine whether tested material 16 includes a crack or other defect.

A control equivalent impedance may represent the equivalent impedance determined for a given combination of a pair of drive electrical contacts and a measurement electrical contact when tested material 16 does not include a crack or other defect. The control equivalent impedance may be based on tested material 16, a model, or an average of a plurality of materials that are similar to or substantially the same as tested material 16. For example, control module 28 may determine the control voltage at a time at which tested material 16 is manufactured, or a time at which an independent measurement (e.g., X-ray radiology or X-ray CT scan) may be used to verify that tested material 16 is intact, undamaged, or does not include a crack. Control module 18 may determine the control equivalent impedance by causing a voltage signal to be applied to a pair of drive electrical contacts from electrical contacts 18, determining a voltage drop across a fixed resistor associated with one or both of the force electrical contact or return electrical contact, and determining the measured voltage using a measurement electrical contact. Control module 28 then may utilize the measured voltage and the voltage drop across the fixed resistor to determine the control equivalent impedance for the selected combination of the pair of drive electrical contacts and the selected measurement contact. In some examples, the control equivalent impedances may be determined using similar or substantially the same combinations of pairs of drive electrical contacts and measurement electrical contact as are used to determine the measured equivalent impedances described above.

In other examples, the control equivalent impedance may be determined using a model of the material in an intact (undamaged) state. For example, control module 28 or another computing device may execute the model of tested material 16 and determine the control equivalent impedance based on the model. In some examples, the model may include a physics-based model of the electrical properties of tested material 16. In some other examples, the control equivalent impedance may be determined as an average (e.g., mean) of a plurality of similar materials (e.g., in geometry and composition) that are known to be intact (undamaged). This control equivalent impedance may be stored (e.g., in a memory device associated with control module 28, a memory device that is part of article 12, or the like) for later use.

Control module 28 may utilize the control equivalent impedance and the measured equivalent impedance to determine whether tested material 16 includes a crack or other defect. For example, control module 28 may determine a difference or ratio between the measured equivalent impedance associated with a measurement electrical contact of electrical contacts 18 and the control equivalent impedance associated with the same measurement electrical contact. Control module 28 then may compare this difference or ratio to a threshold equivalent impedance value or threshold ratio, and may determine that tested material 16 includes a crack or other defect in response to the difference being greater than the threshold voltage value or threshold ratio.

In some examples, rather than utilizing control equivalent impedances, control module 28 may utilize two or move equivalent impedances measured using tested material 16 and a predetermined relationship between the equivalent impedances to determine whether tested material 16 includes a crack or other defect. In some examples, the geometrical configuration of the set of drive electrical contacts and a measurement electrical contact may be selected to allow meaningful comparisons between a first measured equivalent impedance determined using the first measurement electrical contact and a second measured equivalent impedance determined using the second measurement electrical contact. For example, pair of drive electrical contacts may be positioned on the symmetry of tested material 16, e.g., on a plane of symmetry of tested material 26. The first measurement electrical contact and second measurement electrical contact may be positioned symmetrically with reference to the symmetry of tested material 16, e.g., with reference to the plane of symmetry of tested material 16. In such an example, the first measured equivalent impedance and the second measured equivalent impedance are expected to be substantially the same (e.g., the same or nearly the same) in the absence of a crack or other defect in tested material 16. For example, in the absence of a crack or defect in tested material 16, the first equivalent impedance and the second equivalent impedance may be within a predetermined percentage of each other, such as, for example, within about 20%, 10%, 5%, or 1% of each other. Any difference between the first and second measured equivalent impedances that is greater than a threshold difference may indicate that tested material 16 includes a crack or other defect.

As another example, a first pair of drive electrical contacts and a second pair of drive electrical contacts may be different from each other. The first pair of drive electrical contacts and a first measurement electrical contact are a first group of electrical contacts and a second pair of drive electrical contacts and the second measurement electrical contact are a second group of electrical contacts. The first and second group of electrical contacts may be symmetric with each other relative to the symmetry of tested material 16, e.g., a plane of symmetry. As such, in the absence of a crack or other defect in tested material 16 the first measured equivalent impedance and the second measured equivalent impedance are expected be substantially the same (e.g., the same or nearly the same). Any difference between the first and second measured equivalent impedances that is greater than a threshold difference may indicate that tested material 16 includes a crack or other defect.

As a further example, electrical contacts 18 may be positioned so that, for each group that includes a pair of drive electrical contacts and a measurement electrical contact, the measured equivalent impedance in the absence of a crack or other defect is substantially the same. The respective groups of electrical contacts may or may not be symmetric to another group of electrical contacts, and tested material 16 may or may not include a symmetry. As such, regardless of the groups of electrical contacts selected as the first group of electrical contacts and the second group of electrical contacts, in the absence of a crack or other defect in material 16 the first measured equivalent impedance and the second measured equivalent impedance may be substantially the same (e.g., the same or nearly the same). Any difference between measured equivalent impedances that is greater than a threshold difference may indicate that tested material 16 includes a crack or other defect.

In this way, measurement system 10 may utilize article 12 and measurement device 14 to determine whether tested material 16 includes a crack or other defect. By using a measurement system 10 that utilizes a voltage source 34 to provide the electrical signal used to test tested material 16, measurement system 10 may cost less compared to a measurement system that utilizes a current source, as current sources often are more expensive than voltage sources. Additionally, many microcontrollers include built-in voltage sources. Further, by measuring voltage drop across a fixed resistor of fixed resistor array 38 between voltage source 34 and a return node may allow determination of a force current, allowing measurements to be compared between voltage sources or testing instances. This may facilitate use of data determined during a separate testing instance, such as control equivalent impedances representing an intact testing material, to determine whether tested material 16 includes a crack or other defect. In some examples, the equivalent impedances may be equivalent resistances.

Figure 2:
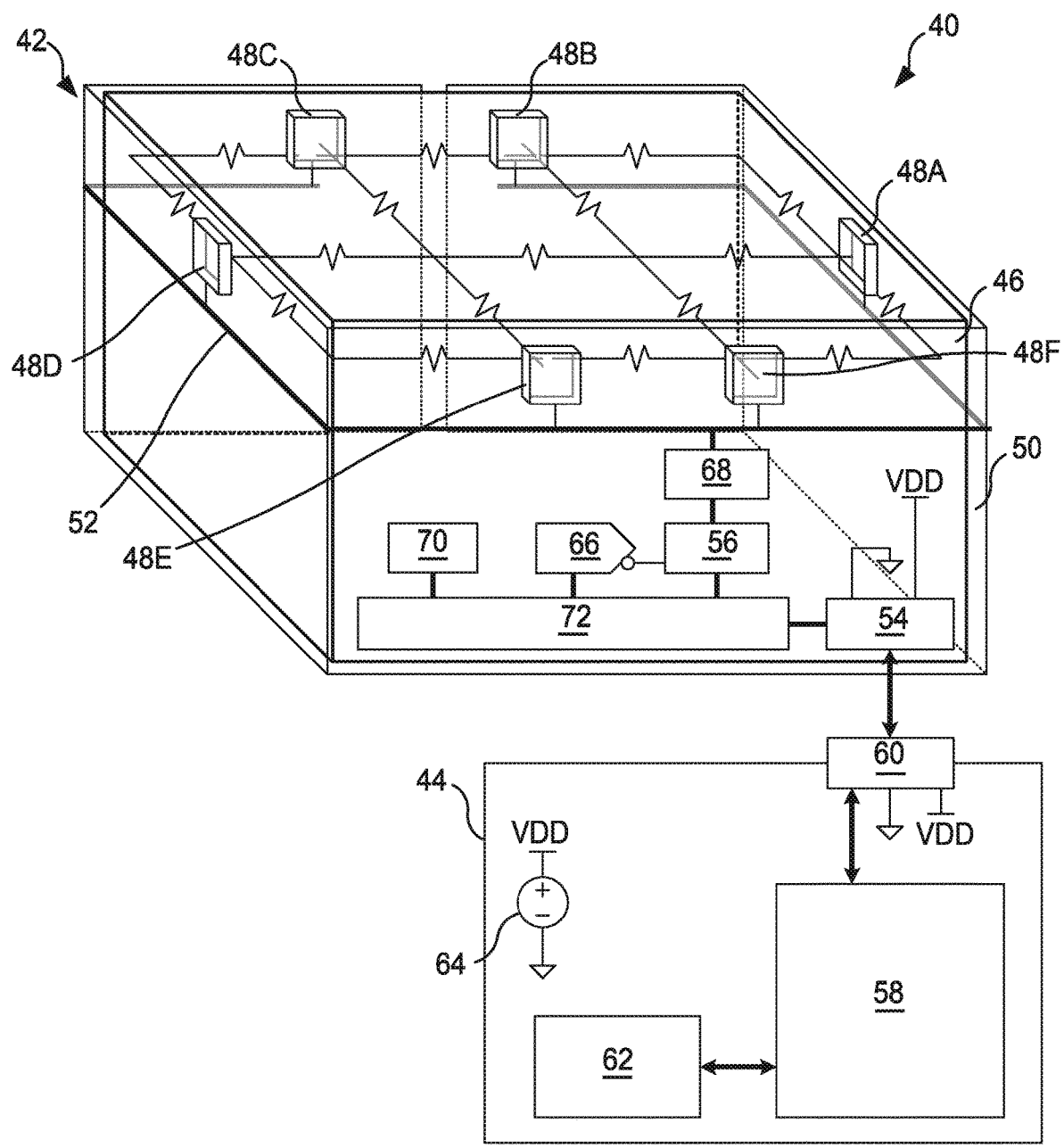

FIG. 1 illustrates an example in which many components of measurement system 10 are incorporated in measurement device 14. In other examples, some or all of the components may be incorporated in article 12. FIG. 2 is a conceptual and schematic block diagram illustrating another example measurement system 40 for determining whether a tested material 46 includes a crack or other defect. In many respects measurement system 40 is similar to measurement system 10 of FIG. 1. However, in measurement system 40, more components are incorporated in article 42 and fewer in measurement device 44. Article 42 may be similar to article 12 of FIG. 1 and measurement device 44 may be similar to measurement device 14 of FIG. 1, aside from the differences described herein.

Similar to article 12 of FIG. 1, article 42 includes tested material 46, a plurality of electrical contacts 48, a substrate 50, a contact routing bus 52, and a first electrical connector 54. Each of these components may be similar to or substantially the same as the corresponding components described with reference to FIG. 1.

Similar to measurement device 14 of FIG. 1, measurement device 44 of FIG. 2 includes a controller 58, a second electrical connector 60, a user interface device 62, and a voltage source 64. Each of these components may be similar to or substantially the same as the corresponding components described with reference to FIG. 1.

Unlike measurement system 10 of FIG. 1, in measurement system 40, article 42 includes a PSA 56, an ADC 66, and a fixed resistor array 68. Each of these components may be similar to or substantially the same as the corresponding components described with reference to FIG. 1. Further, each of these components may be attached to substrate 50 and electrically connected to conductive traces on or in substrate 50. Article 42 also includes a non-volatile memory (NVM) device 70 and a data communication and control device 72.

NVM 70 may be attached to substrate 50 and electrically connected to data communication and control device 72 using electrical traces in or on substrate 50. NVM 70 may include any type of non-volatile memory, including, for example, Read-only memory (ROM), electrically programmable read-only memory (EPROM), electrically erasable programmable read-only memory (EEPROM), flash memory, ferroelectric random access memory (FRAM), magnetoresistive random access memory (MRAM), giant magnetoresistive random access memory (GMRAM), phase change random access memory (PRAM), chalcogenide random access memory (CRAM), carbon nanotube-based random access memory (NRAM), or the like.

In some examples, NVM 70 may store a plurality of control equivalent impedances in a data structure in which each respective control equivalent impedance is associated with a pair of drive electrical contacts used to apply the voltage signal to tested material 46 and a measurement electrical contact used to determine the control equivalent impedance (whether the control equivalent impedance was actually determined using tested material 46, determined using multiple representative tested materials similar to tested material 46, or determined using a physics-based model of tested material 46).

Article 42 also includes data communication and control device 72. Data communication and control device 72 is electrically connected to first electrical connector 54, PSA 56, ADC 66, and NVM 70. In measurement system 40, control module 58 controls overall operation of system 40. Control module 58 may communicate commands to data communication and control device 72 via first connector 54 and second connector 60. Data communication and control device 72 then controls PSA 56, ADC 66, and NVM 70 based on the commands received from control module 58. Further, once ADC 66 determines voltage, data communication and control device 72 may retrieve the measured voltages from ADC 66 and communicate the voltages to control module 58. Control module 58 then may determine whether tested material 46 includes a crack or other defect based on the measured voltages. In some examples, control module 58 also may cause data communication and control device 72 to retrieve one or more control equivalent impedances from NVM 70 and communicate the one or more control equivalent impedances to controller 58 for use in determining whether tested material 46 includes a crack or other defect.

Figure 3:
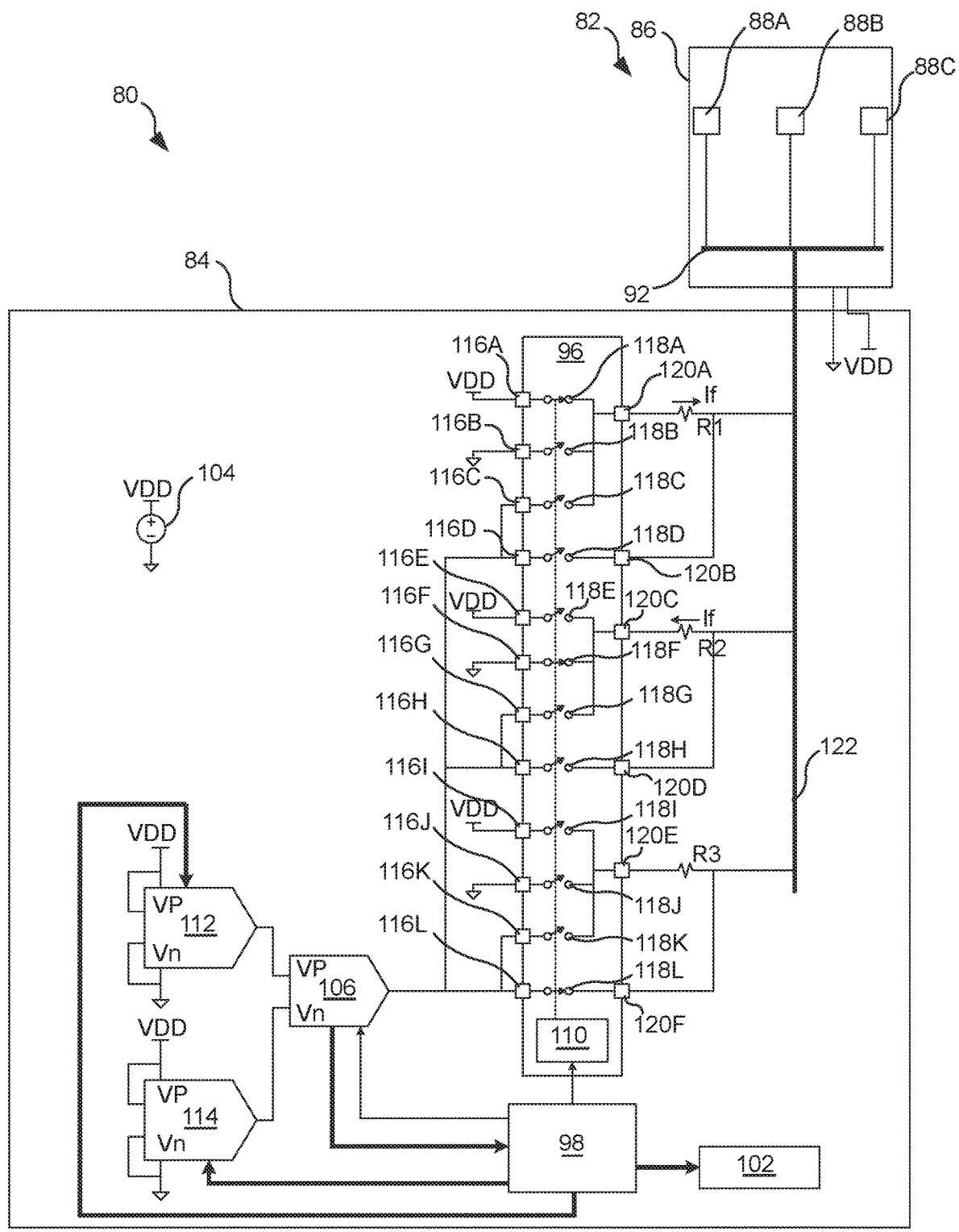
FIGS. 3 and 4 are a functional circuit diagrams illustrating an example measurement system for determining whether a tested material includes a crack or other defect.

FIG. 3 is a functional circuit diagram illustrating an example measurement system 80 for determining whether a tested material 86 includes a crack or other defect. Measurement system 80 of FIG. 3 includes an article 82 and a measurement device 84. Article 82 includes tested material 86, a plurality of electrical contacts 88A-88C (collectively, "electrical contacts 88"), a contact routing bus 92. Aside from any differences described herein, each of these components may be similar to the corresponding components described with respect to FIGS. 1 and 2.

Measurement device 84 includes a programmable switch array (PSA) 96, a control module 98, a user interface device 102, a voltage source 104, an analog-to-digital converter (ADC) 106, a first optional digital-to-analog converter (DAC) 112, a second optional DAC 114, a bus 122, and fixed resistors R1-R3. Aside from any differences described herein, each of these components may be similar to the corresponding component described with respect to FIGS. 1 and 2. Although not shown in FIG. 3, in some examples, measurement device 84 and article 82 may be electrically connected using optional electrical connectors, which may be similar to or substantially the same as first and second electrical connectors 24 and 30 described with reference to FIG. 1.

As shown in FIG. 3, PSA 96 includes a plurality of outputs 116A-116L (collectively, "outputs 116"), a plurality of switches 118A-118L (collectively, "switches 118"), a plurality of inputs 120A-120F (collectively, "inputs 120"), and a PSA controller 110. Each of outputs 116 is electrically connected to one of a positive terminal of voltage source 104 (VDD), a return node (e.g., ground), or an input of ADC 106. For example, outputs 116A, 116E, and 116I are connected to VDD, outputs 116B, 116F, and 116J are connected to ground, and outputs 116C, 116D, 116G, 116H, 116K, and 116L are connected to an input of ADC 106. Each of outputs 116 is also connected to a respective switch of switches 118 in PSA 96. In the example of FIG. 3, PSA 96 includes 4*N outputs and 4*N switches, where N is the number of electrical contacts 88 (three in FIG. 3).

PSA 96 also includes plurality of inputs 120. Each input is connected to bus 122 either directly or via a fixed resistor R1-R3. For example, input 120A is connected to fixed resistor R1, which is connected to bus 122. Input 120C is connected to fixed resistor R2, which is connected to bus 122, and input 120E is connected to fixed resistor R3, which is connected to bus 122. Inputs 120B, 120D, and 120F are directly connected to bus 122.

Each electrical contact of electrical contacts 88 is thus associated with and connected to two inputs of inputs 120, four switches of switches 118, and four outputs of outputs 116. For example, first electrical contact 88A is electrically connected to fixed resistor R1 and second input 120B via bus 122. Fixed resistor R1 is connected to input 120A. Input 120A is selectively connected to outputs 116A-116C via switches 118A-118C, respectively, and input 120B is selectively connected to output 116D via switch 118D. Similarly, second electrical contact 88B is electrically connected to fixed resistor R2 and input 120D via bus 122. Fixed resistor R2 is connected to input 120C. Input 120C is selectively connected to outputs 116E-116G via switches 118E-118G, respectively, and input 120B is selectively connected to output 116H via switch 118H. Third electrical contact 88C is electrically connected to fixed resistor R3 and input 120F via bus 122. Fixed resistor R3 is connected to input 120E. Input 120E is selectively connected to outputs 116I-116K via switches 118I-118K, respectively, and input 120F is selectively connected to output 116L via switch 118L.

In this way, any one of electrical contacts 88 may be selectively electrically connected to VDD to function as a force electrical contact, to ground to function as a return electrical contact, or to ADC 106 to function as a measurement electrical contact. For example, control module 98 may control PSA controller 110 to cause selected switches of switches 118 to be opened and closed to configure electrical contacts 88 as desired combinations of force electrical contact, return electrical contact, and measurement electrical contact.

Although FIG. 3 illustrates three electrical contacts 88 and corresponding numbers of inputs 120, switches 118, and outputs 116, in other examples, measurement system 80 may include additional electrical contacts, and measurement device 84 may include additional inputs 120, switches 118, and outputs 116.

In the example illustrated in FIG. 3, first switch 118A is closed so input 120A is electrically connected to VDD. This results in first electrical contact 88A being a force electrical contact, and resistor R1 being connected in series between VDD and the force electrical contact. Second switch 118B, third switch 118C, and fourth switch 118D are open.

Sixth switch 118F is also closed, so input 120C is electrically connected to ground through output 118F. This results in second electrical contact 88B being a return electrical contact, and resistor R2 being connected in series between ground (the return node) and the return electrical contact. Fifth switch 118E, seventh switch 118G, and eighth switch 118H are open.

Twelfth switch 118L is also closed, so input 120F is electrically connected to output 116L and ADC 106. This results in third electrical contact 88C being a measurement electrical contact. Ninth switch 118I, tenth switch 118J, and eleventh switch 118L are open.

Hence, in the illustrated example, controller 98 may cause voltage source 104 to output a voltage signal at VDD through output 116A, first switch 118A, and input 120A. The voltage signal conducts through fixed resistor R1, bus 122, contact routing bus 92, and first electrical contact 88A. The voltage signal then conducts through at least a portion of tested material 86 between first electrical contact 88A and second electrical contact 88B. The voltage signal returns to ground via contact routing bus 92, bus 122, fixed resistor R2, input 120C, switch 118F, and output 116F. ADC 106 measures the voltage at third electrical contact 88C via contact routing bus 92, bus 122, input 120F, switch 118L, and output 116L.

By outputting commands to PSA controller 110, control module 98 may control which of electrical contacts 88 is used as a force electrical contact, a return electrical contact, and a measurement electrical contact. Further, control module 98 may control which voltages are measured by ADC 106. For example, by causing PSA controller 110 to close first switch 118A and sixth switch 118F, control module 98 may cause first electrical contact 88A to be a force electrical contact and second electrical contact 88B to be a return electrical contact. Control module 98 then may cause PSA controller 110 to close third switch 118C to connect input 120A to ADC 106. This may allow ADC 106 to measure a force voltage, i.e., the voltage of the voltage signal input to fixed resistor R1. By causing PSA controller 110 to then open third switch 118C and close fourth switch 118C, control module 98 may cause ADC 106 to measure a voltage associated with fixed resistor R1. Control module 98 then may utilize the force voltage and the voltage associated with fixed resistor R1 to determine a voltage drop across fixed resistor R1, and may optionally determine a force current $I_f$ based on the voltage drop across fixed resistor R1 and the resistance of fixed resistor R1. Control module 98 may cause PSA controller 110 to open fourth switch 118D and close twelfth switch 118L to cause ADC 106 to measure the voltage at third electrical contact 88C, which is a measured voltage.

In this way, measurement system 80 may determine measured voltages for each of a plurality of measurement electrical contacts for each of at least one pair of drive electrical contacts (e.g., force and return electrical contacts). As described above with reference to FIG. 1, control module 98 may utilize the measured voltages and voltage drop across the fixed resistor associated with the force electrical contact, the fixed resistor associated with the return electrical contact, or both to determine an equivalent impedance associated with the measurement electrical contact, and may determine whether tested material 86 includes a crack or other defect based on the measured equivalent impedances.

As shown in FIG. 3, measurement device 84 optionally includes first and second DACs 112 and 114. First optional DAC 112 is electrically connected to positive reference voltage input of ADC 106, and second optional DAC 114 is electrically connected to negative reference voltage input of ADC 106. Control module 98 may control first optional DAC 112 and second optional DAC 114 to output voltages to be reference voltages for ADC 106, which affects a resolution of ADC 106. For example, a transfer function of ADC 106 may be:

$$ADC(V_{in}) = (2^{Nbit} - 1) * V_{in} / V_{ref}$$

where Nbit is the resolution of ADC 106 in bits, $V_{in}$ is the ADC input voltage, and $V_{ref}$ is the reference voltage for ADC 106. In some examples in which measurement device 84 omits first and second optional DACs 112 and 114, $V_{ref}$ may be VDD, as the positive reference voltage input may be connected to VDD and the negative reference voltage input may be connected to ground. For such as system, the minimum material resistance will be 0 ohms and the maximum material resistance will be infinite (an open circuit), so the minimum voltage measured using any of electrical contacts 88 will be:

$$V_{ADC}(min) = VDD * (R_n + R_{parg}) / 2 * R_n + R_{parf} + R_{parg})$$
$$\sim VDD/2$$

where $V_{ADC}(min)$ is the minimum voltage measured by ADC 106, $R_n$ is the resistance of fixed resistors R1-R3, $R_{parg}$ is the parasitic resistance of the switch of switches 118 connecting an input of inputs 120 to ground, $R_{parf}$ is the parasitic resistance of the switch of switches 118 connecting an input of inputs 120 to VDD. Hence, only about one-half of the voltage range of ADC 106 is utilized.

By including first and second optional DACs 112 and 114, the resolution of ADC 106 may be increased by reducing the input voltage range of ADC 106. For example, if the negative reference voltage input of ADC 106 is set to approximately VDD/2 rather than ground and the positive reference voltage input of ADC 106 is set to VDD, the resolution of ADC 106 is doubled. If the maximum material resistance is finite and bounded or if the open circuit state is deemed an error, then the maximum voltage measured using any of electrical contacts 88 will be:

$$V_{ADC}(max) = VDD * (R_n + R_{eqmax} + R_{parg}) / 2 * R_n + R_{eqmax} + R_{parf} + R_{parg}) \sim VDD * (R_n + R_{eqmax}) / 2 * R_n + R_{eqmax})$$
$$= K_{max} * VDD$$

where $R_{eqmax}$ is the maximum expected equivalent impedance, and $$K_{max} = (R_n + R_{eqmax}) / (2 * R_n + R_{eqmax}) < 1$$

If the positive reference voltage input of ADC 106 is set to $K_{max} * VDD$ rather than VDD, then the resolution of the ADC measurements increases by a factor of $(1/K_{max})$. In some examples, control module 98 (or a NVM device, such as NVM device 70 of FIG. 2) may store DAC values associated with tested material 86, and control module 98 may control first and second optional DACs 112 and 114 to output voltages equal to predetermined values, such as $K_{max} * VDD$ and VDD/2, respectively, to increase resolution of ADC 106.

Figure 4:
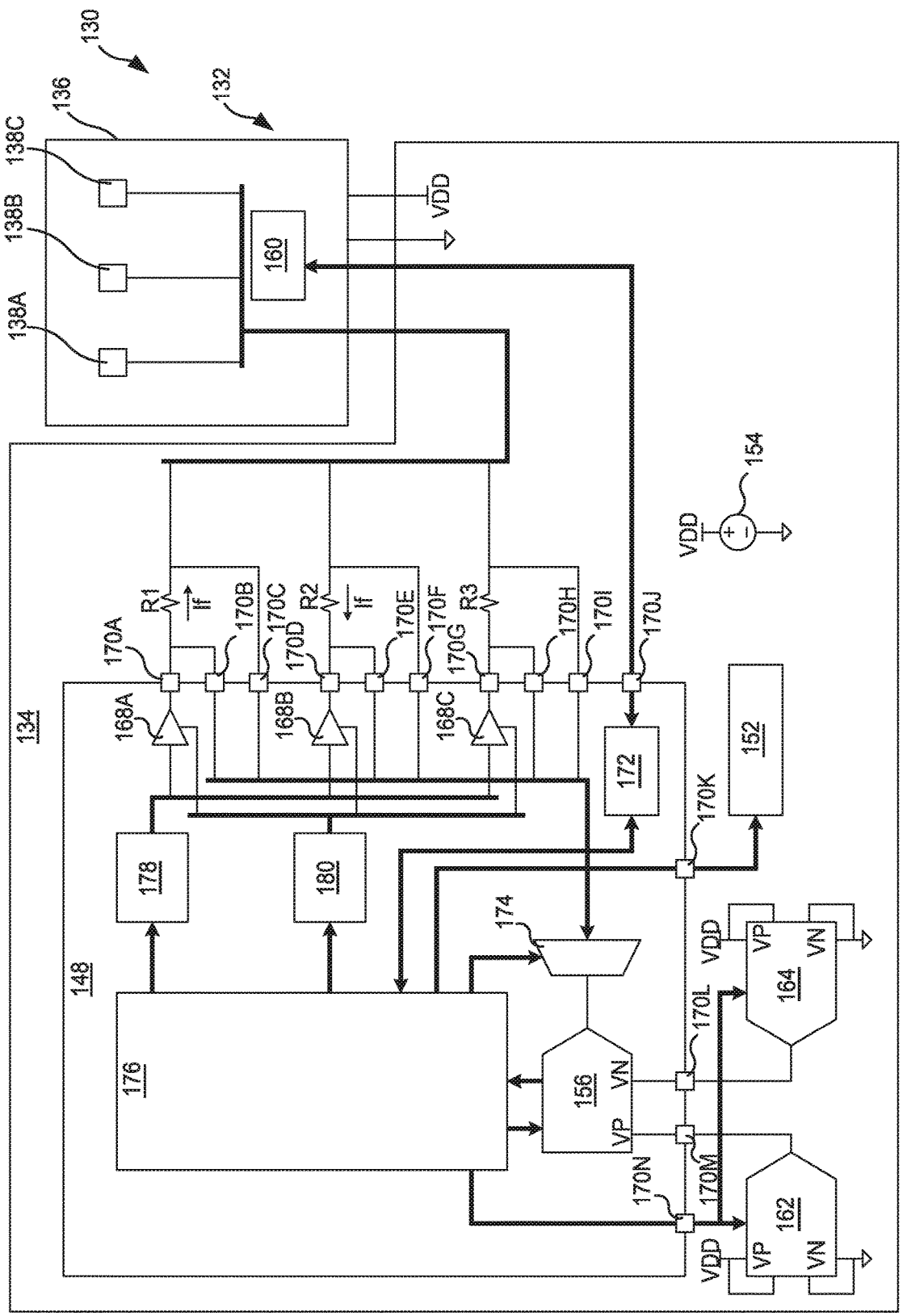

In some examples, multiple functions attributed to separate components in FIG. 3 may be implemented in a single microcontroller. For example, FIG. 4 is a functional circuit diagrams illustrating an example measurement system 130 for determining whether a tested material 136 includes a crack or other defect. Measurement system 130 of FIG. 4 includes an article 132 and a measurement device 134. Article 132 includes tested material 136, a plurality of electrical contacts 138A-138C (collectively, "electrical contacts 138"), and a NVM device 160. Aside from any differences described herein, each of these components may be similar to the corresponding components described with respect to FIGS. 1-3.

Measurement device 134 includes a micro controller 148, a user interface device 152, a voltage source 154, fixed resistors R1-R3, a first optional DAC 162, and a second optional DAC 164. Microcontroller 148 includes a control module 176, an ADC 156, a multiplexer 174, a memory controller 172, an N-bit output register 178, an N-bit tristate register 180, a plurality of three-way switches 168A-168C (collectively, "three-way switches 168"), and a plurality of ports 170A-170N (collectively, "ports 170"). Aside from any differences described herein, each of these components may be similar to the corresponding component described with respect to FIGS. 1-3. Although not shown in FIG. 4, in some examples, measurement device 84 and article 82 may be electrically connected using optional electrical connectors, which may be similar to or substantially the same as first and second electrical connectors 24 and 30 described with reference to FIG. 1.

Microcontroller 148 controls operation of measurement system 130. For example, control module 176 of microcontroller 148 controls N-bit output register 178 and N-bit tristate register 180 to control positions of three-way switches 168 to connect a selected one of electrical contacts 138 to VDD, to connect a selected one of electrical contacts 138 to ground, and a selected node (e.g., one of electrical contacts, one of ports 170A-170I, or the like) to multiplexer 174. Control module 176 also controls multiplexer 174 to select a line to be input to ADC 156. In this way, the combination of N-bit output register 178, N-bit tristate register 180, three-way switches 168, and multiplexer implement similar functionality as PSA 96 of FIG. 3.

Control module 176 also may control memory controller 172 to read data from and write data to NVM device 160. For example, control module 176 may control memory controller 172 to read and/or write control equivalent impedances or DAC values from NVM device 160. Association between the control equivalent impedances and the article 132 may be maintained by the physical association between NVM device 160 and article 132. This may be simpler than storing control equivalent impedances in another device (e.g., a measurement device), a server, the cloud, or the like, as no logical associations between a set of control equivalent impedances and an article may be required.

Control module 176 also may control first and second optional DACs 162 and 164, to output voltages to positive reference voltage input, VP, and negative reference voltage input, VN, of ADC 156. In some examples, for each of first and second optional DACs 162 and 164, the positive reference voltage input, VP, is connected to VDD, and the negative reference voltage input, VN, is connected to ground. Incorporating multiple functions, including control, switches, an ADC, and a memory controller, in a single microcontroller 148 may simplify and make cheaper and more reliable measurement device 134, e.g., compared to discrete components for each of these functions.

Figure 5:
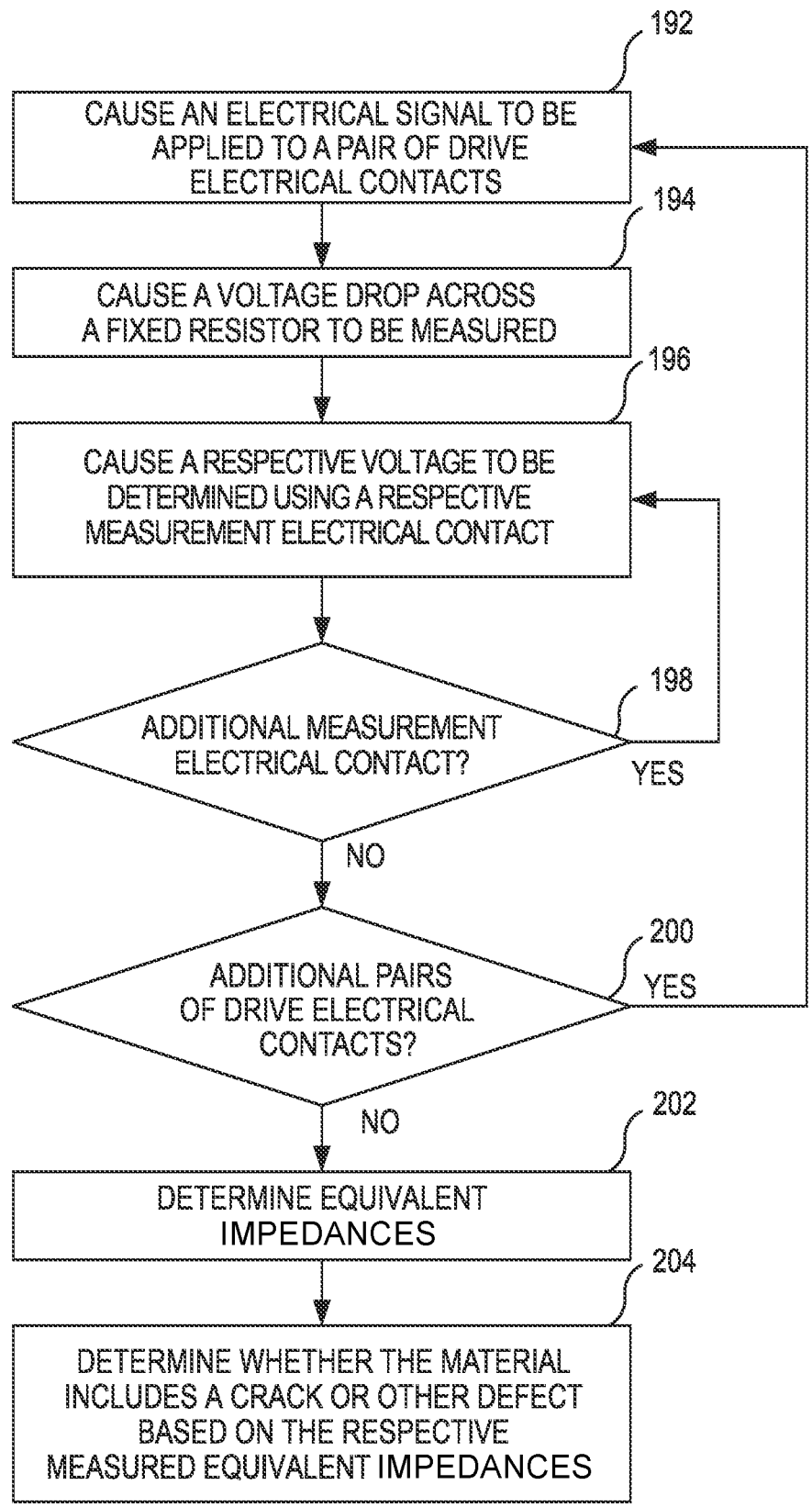
FIG. 5 is flow diagram illustrating an example technique for determining whether a tested material includes a crack or other defect.

FIG. 5 is a flow diagram illustrating an example technique for determining whether a tested material includes a crack or other defect. The technique of FIG. 5 will be described with concurrent reference to measurement system 80 of FIG. 3, but it will be understood that other systems may perform the technique of FIG. 5 (e.g., system 10 of FIG. 1, system 40 of FIG. 2, or system 130 of FIG. 4), and that measurement system 80 may be used to perform other techniques.

The technique of FIG. 5 may include causing, by control module 98, a voltage signal to be applied to a pair of drive electrical contacts (192). For example, control module 98 may output a control signal to cause PSA controller 110 to open and close switches 118 to connect a first selected electrical contact of electrical contacts 88 to VDD and a second selected electrical contact of electrical contacts 88 to ground. The selected pair of electrical contacts 88 may include any two electrical contacts of electrical contacts 88. In some examples, the selected pair of electrical contacts 88 may be adjacent to each other; in other examples, the selected pair of electrical contacts 88 may be spaced apart. For example, in some instances, the selected pair of electrical contacts 88 may be substantially opposite each other in the array of electrical contacts 88, or may be separated by a predetermined number of electrical contacts 88, e.g., separated by one electrical contact of electrical contacts 88. In some examples, the pair of electrical contacts 88 may include two electrical contacts that are on a symmetry of tested material 86.

Control module 98 then may cause voltage source 104 to apply the voltage signal to the first pair of drive electrical contacts, e.g., via the selected switches of switches 118 and the selected electrical contacts of electrical contacts 88. The electrical signal may include an AC signal or a DC signal, and may include a voltage signal. In some examples, the type of electrical signal may depend on the composition of tested material 86. For example, a DC signal may be used to measure a voltage of an electrically conductive or electrically semiconductive material, while an AC signal may be used to measure a voltage of an electrically conductive material, an electrically semiconductive material, or a dielectric material. Control module 98 also may control the amplitude, duration, frequency, and other signal characteristics of the electrical signal.

The technique of FIG. 5 also includes, while voltage source 104 is applying the voltage signal to the pair of drive electrical contacts (192), causing a voltage drop across a fixed resistor to be measured (194). For example, control module 98 may cause ADC 106 to measure at least two voltages to determine the voltage drop across the fixed resistor. The fixed resistor may be connected in series between VDD and the force electrical contact or in series between the return electrical contact and the return node (e.g., ground). For example, in instances in which first electrical contact 88A is electrically connected to VDD as a force electrical contact and second electrical contact 88B is electrically connected to ground as a return electrical contact (as shown in FIG. 3), control module 98 may cause ADC 106 to measure the voltage drop across fixed resistor R1, fixed resistor R2, or both, to be measured. For purposes of illustration only, the following discussion will be directed to measuring the voltage drop across fixed resistor R1.

Control module 98 may control which voltages are measured by ADC 106 by causing PSA controller 110 to control positions of switches 118 to connected selected points to ADC 106. For example, by causing PSA controller 110 to close first switch 118A and sixth switch 118F, control module 98 may cause first electrical contact 88A to be a force electrical contact and second electrical contact 88B to be a return electrical contact. Control module 98 then may cause PSA controller 110 to close third switch 118C to connect input 120A to ADC 106. This may allow ADC 106 to measure a force voltage, i.e., the voltage of the voltage signal input to fixed resistor R1. By causing PSA controller 110 to then open third switch 118C and close fourth switch 118D, control module 98 may cause ADC 106 to measure a voltage associated with fixed resistor R1. Control module 98 then may utilize the force voltage and the voltage associated with fixed resistor R1 to determine a voltage drop across fixed resistor R1, and may optionally determine a force current $I_f$ based on the voltage drop across fixed resistor R1 and the resistance of fixed resistor R1.

The technique of FIG. 5 also includes, while voltage source 104 is applying the voltage signal to the pair of drive electrical contacts (192), causing a measured voltage to be determined using a measurement electrical contact electrically coupled to tested material 86 (196). For example, control module 98 may cause PSA controller 110 to open fourth switch 118D and close twelfth switch 118L to cause ADC 106 to measure the voltage at third electrical contact 88C, which is a measured voltage.

In examples in which article 82 includes more than three electrical contacts, the selected measurement electrical contact may be any electrical contact from electrical contacts 88. Regardless of the particular electrical contact connected to ADC 106, control module 98 may cause ADC 106 to determine a voltage using the measurement electrical contact (196) while voltage source 104 applies the voltage signal to the pair of drive electrical contacts (192).

In some examples, control module 98 may be configured to cause ADC 106 to determine a respective measured voltage for each of a plurality of measurement electrical contacts for each pair of drive electrical contacts. Hence, in some examples, the technique of FIG. 5 further includes determining whether there is an additional measurement electrical contact for which to determine a measured voltage (198) for the selected pair of drive electrical contacts. In response to determining that there is an additional electrical contact to be used as a measurement electrical contact (the "YES" branch of decision block 198), control module 98 may cause PSA 96 to couple the selected electrical contact to ADC 106. Control module 98 then may cause ADC 106 to determine a measured voltage using the selected measurement electrical contact (196).

Control module 98 may repeat this determination of whether additional electrical contacts 88 are to be used as a measurement electrical contact (198), causing coupling of a selected measurement electrical contact to ADC 106 using PSA 96, and causing ADC 106 to determine a respective measured voltage (196) until control module 98 determines there are no additional electrical contacts 88 to be used as a measurement electrical contact for the selected pair of drive electrical contacts (the "NO" branch of decision block 198).

In some examples, the technique of FIG. 5 optionally includes determining, by control module 98, whether there is an additional pair of drive electrical contacts to which to apply the electrical signal (200). For example, control module 98 may be configured to utilize each unique pair of electrical contacts from electrical contacts 88 or each unique pair of electrical contacts separated by a predetermined number of electrical contacts (e.g., one electrical contact) as a pair of drive electrical contacts. In other examples, only a single pair of electrical contacts 88 may be utilized as a pair of drive electrical contacts, and the technique of FIG. 5 may not include determining whether there is an additional pair of drive electrical contacts to which to cause the electrical signal to be applied (200).

For each pair of drive electrical contacts, control module 98 may cause PSA 96 to couple a selected pair of electrical contacts to VDD and ground, respectively, cause voltage source 104 to apply the voltage signal to the pair selected of electrical contacts (192), determine a voltage drop across a fixed resistor connected in series between VDD and ground (194), cause PSA 96 to couple a selected electrical contact to ADC 106 as a measurement electrical contact, cause ADC 106 to determine a measured voltage using the measurement electrical contact (196), determine whether additional electrical contacts 88 are to be used as a measurement electrical contact (198), cause coupling of a new selected measurement electrical contact to ADC 106 using PSA 96, and cause ADC 106 to determine a respective measured voltage (196) until control module 98 determines there are no additional electrical contacts 88 to be used as a measurement electrical contact for the selected pair of drive electrical contacts (the "NO" branch of decision block 200).

Once control module 98 has determined that there are no additional pairs of electrical contacts 88 to be used as a pair of drive electrical contacts (the "NO" branch of decision block 200), control module 98 may determine equivalent impedances for each measured voltage (202). For example, for each selected pair of drive electrodes, control module 98 caused ADC 106 to measure a force voltage and a voltage associated with the fixed resistor associated with the selected pair of drive electrodes. Using the resistance of the fixed resistor, the force voltage, and the voltage associated with the fixed resistor, control module 98 may determine a force current. For example, control module 98 may determine the force current using the equation:

$$I_f = (V_f - V_{node1})/R_n$$

where $I_f$ is the force current, $V_f$ is the force voltage, $V_{node1}$ is the voltage associated with the fixed resistor, and $R_n$ is the resistance of the fixed resistor. Control module 98 then may utilize the respective force current associated with each pair of drive electrical contacts to determine equivalent impedances associated with each measurement electrical contact utilized with the pair of drive electrical contacts.

In other examples, control module 98 may determine the equivalent impedance between a pair of electrical contacts based on the following equation:

$$R[P, Q] = (Vnode[P] - Vnode[Q])/I_f$$
$$= R_n[F] * (Vnode[P] - Vnode[Q])/(V_f - Vnode[F])$$

where R[P,Q] is the equivalent impedance between electrical contact P and electrical contact Q, Vnode[P] is the voltage on the electrical contact side of the fixed resistor associated with electrical contact P, Vnode[Q] is the voltage on the electrical contact side of the fixed resistor associated with electrical contact Q, $R_n[F]$ is the fixed resistance in series with the force electrical contact, $V_f$ is the force voltage, and Vnode[F] is the voltage on the electrical contact side of the fixed resistor associated with force electrical contact F.

Because the force voltage, $V_f$, is a function of VDD, all voltage measurements are proportional to VDD. To allow comparisons between materials measured with different voltage sources, e.g., with different measurement devices 84, the dependence upon VDD may be accounted for or eliminated. As described above, ADC 106 measures and digitizes all voltages. The transfer function for ADC 106 is:

$$ADC(V_{in}) = (2^{Nbit} - 1) * V_{in}/V_{ref}$$

where Nbit is the resolution of ADC 106 in bits, $V_{in}$ is the ADC input voltage, and $V_{ref}$ is the reference voltage for ADC 106. In some examples in which measurement device 84 omits first and second optional DACs 112 and 114, $V_{ref}$ may be VDD, as the positive reference voltage input may be connected to VDD and the negative reference voltage input may be connected to ground. For such systems, the measurement code for a given input voltage to ADC 106 is:

$$ADC(V_{in}) = (2^{Nbit} - 1) * V_{in}/VDD$$

For any electrical contact P, the electrical contact voltage is:

$$Vnode[P] = (Req[P,G] + R_n + R_{parg}) * VDD/(2*R_n + Req[F,G] + R_{parf} + R_{parg})$$

Vnode[P] is the voltage at electrical contact P, Req[P,G] is the equivalent material resistance between electrical contact P and the return electrical contact G, Req[F,G] is the equivalent material resistance between the force electrical contact F and the return electrical contact G, $R_n$ is the fixed resistor resistance, $R_{parg}$ is the parasitic resistance of the switch of switches 118 connecting an input of inputs 120 to ground, $R_{parf}$ is the parasitic resistance of the switch of switches 118 connecting an input of inputs 120 to VDD.

Given the following:

$$Req[P,G] = K_1 * Req[F,G] \text{ and } 0 < K1 \leq 1;$$

$$K_2 = R_n + R_{parg}$$

$$K_3 = 2*R_n + R_{parf} + R_{parg}$$

$$K_{adc} = (2^{Nbit} - 1)$$

Then the code for ADC 106 for node voltage Vnode[P] is:

$$ADC(Vnode[P]) = K_{adc} * [(K_1 * Req[F, G] + K_2) *$$
$$VDD/(Req[F, G] + K_3)]/VDD$$
$$= K_{adc} * (K_1 * Req[F, G] + K_2)/(Req[F, G] + K_3)$$

Therefore, all node voltage measurements are independent of the source voltage VDD and are ratiometric with respect to the gain constant $K_{adc}$ for ADC 106.

Once control module 98 has determined the equivalent impedances (202), control module 98 may determine whether tested material 86 includes a crack or other defect based on the measured equivalent impedance or measured equivalent impedances (204).

In some examples, control module 98 may determine whether tested material 86 includes a crack or other defect based on a comparison between equivalent impedances. For example, control module 98 or another computing device may perform steps (192)-(202) of the technique of FIG. 5 on tested material 86 at a first time at which it is known that tested material 86 is intact, i.e., does not include a crack or other defect. For example, the first time may be a time at which tested material 86 is manufactured, or a time at which an independent measurement (e.g., X-ray radiology or X-ray CT scan) may be used to verify that tested material 86 is intact, undamaged, or does not include a crack. These respective control equivalent impedances may be stored in an NVM device (e.g., NVM device 70 of FIG. 2) for later use. For example, the respective control equivalent impedances may be stored in a data structure in which each respective control equivalent impedance is associated with a pair of drive electrical contacts to which the electrical signal was applied during the voltage measurement and a pair of measurement electrical contacts with which the respective voltage used to determine the equivalent impedance was measured. In other examples, the control equivalent impedances may be determined using a model of the material in an intact (undamaged) state, or the control equivalent impedances may be determined as an average (e.g., mean) of a plurality of similar materials (e.g., in geometry and composition) that are known to be intact (undamaged).

Control module 98 may retrieve the control equivalent impedances from the NVM device. Control module 98 then may compare the respective measured equivalent impedances to respective control equivalent impedances and determine whether tested material 86 includes a crack or other defect based on the comparison. For example, control module 98 may compare each respective measured equivalent impedance with a corresponding (i.e., associated with the same pair of drive electrical contacts and the same pair of measurement electrical contacts) control equivalent impedance As an example, control module 98 may subtract the corresponding control equivalent impedance from the respective measured equivalent impedance. In some examples, control module 98 may compare the respective equivalent impedance difference (between the respective measurement equivalent impedance and the respective control equivalent impedance) to a threshold equivalent impedance value.

The threshold equivalent impedance value may be selected so that an equivalent impedance difference above the threshold equivalent impedance value is meaningful (e.g., indicative of a crack or other defect) and an equivalent impedance difference below the threshold equivalent impedance value is not meaningful (e.g., is not indicative of a crack or other defect). In some examples, the threshold value may be selected to be an equivalent impedance value that is slightly greater than a noise floor of the measurement, such that any equivalent impedance difference that exceeds the noise floor is determined by control module 98 to be indicative of a crack or other defect.

In some examples, after comparing each respective measured equivalent impedance against a corresponding control equivalent impedance and comparing the difference to the threshold equivalent impedance value to determine if the respective measurement voltage is indicative of a crack or other defect, control module 98 may determine whether a crack or other defect is present in tested material 86 based on the plurality of indications. For example, control module 98 may determine a number of differences that are indicative of a crack and compare this number of differences to a threshold number of differences to determine if tested material 86 includes a crack or other defect.

As another example, control module 98 may determine whether tested material 86 includes a crack or other defect based on the respective measured equivalent impedances (204) by comparing each respective measured voltage to a threshold equivalent impedance value. For example, control module 98 may compare the respective measured equivalent impedance to the threshold equivalent impedance value, and may determine that the respective measured equivalent impedance indicates that tested material 86 includes a crack or other defect in response to the respective measured equivalent impedance being greater than the threshold equivalent impedance value. In some examples, the threshold equivalent impedance may be selected so that a measured equivalent impedance above the threshold equivalent impedance value is indicative of a crack or other defect and a measured equivalent impedance below the threshold equivalent impedance value is not indicative of a crack or other defect. In some examples, after comparing each respective measured equivalent impedance to the threshold equivalent impedance value to determine if the respective measured equivalent impedance is indicative of a crack or other defect, control module 98 may determine whether tested material 86 includes a crack or other defect based on the plurality of indications. For example, control module 98 may determine a number of measured equivalent impedances that are indicative of a crack and compare this number of measured equivalent impedances to a threshold number of measured equivalent impedances to determine if tested material 86 includes a crack or other defect.

In some examples, rather than utilizing differences between a measured equivalent impedance and a corresponding control equivalent impedance, control module 98 may determine a ratio between each respective measured equivalent impedance and a corresponding respective control equivalent impedance. In some examples, multiple measured equivalent impedances may be associated with the same measurement electrical contact from electrical contacts 88, e.g., due to multiple measurements with different pairs of drive electrical contacts. In some such examples, control module 98 may determine a ratio between each respective measured equivalent impedance and the respective control equivalent impedance associated with the same electrical contact. By determining a ratio between the measured equivalent impedance and the control equivalent impedance, effects of temperature differences in tested material 86 between the time at which the control equivalent impedance was determined and the measured equivalent impedance was determined may be reduced.

Control module 98 may utilize the ratio(s) in one of a variety of techniques to determine whether tested material 86 includes a crack or other defect. For example, control module 98 may utilize pattern recognition. In some examples, for each measurement electrical contact from electrical contacts 88, control module 98 may sum all ratios associated with the respective measurement electrical contact. Control module 98 may then determine whether any adjacent sets of measurement electrical contacts are associated with sums that follow a predetermined pattern, such as a low-high-low pattern, a low-high-high-high-low pattern, or the like. The particular pattern that indicates that tested material 86 includes a crack or other defect may depend on positioning of electrical contacts 88, including spacing between adjacent electrical contacts of electrical contacts 88; crack location and orientation within tested material 86; and the like. In other examples, control module 98 may use pattern recognition on each set of ratios associated with a respective measurement electrical contact, and may compare the results of the various pattern recognitions to arrive at a final determination of whether tested material 86 includes a crack or other defect.

As another example, control module 98 may determine whether tested material 86 includes a crack or other defect by determining whether any of the measured equivalent impedances, ratios, or the sum of measured equivalent impedances or ratios, associated with a single pair of measurement electrical contacts, is an outlier compared to measured equivalent impedances, ratios, or sums of measured equivalent impedances or ratios, associated with other measurement electrical contacts. Cracks or other defects are expected to create regions of higher electrical resistance in tested material 86. Hence, an outlier of higher equivalent impedances or ratios indicates that tested material 86 includes a crack or other defect.

As a further example, control module 98 may determine whether tested material 86 includes a crack or other defect by determining an overall score for tested material 86. For example, control module 98 may sum all ratios associated with a respective measurement electrical contact to generate a single value associated with each respective measurement electrical contact. Control module 98 then may mathematically manipulate these values to arrive at a single score for tested material 86. For example, control module 98 may sum the ratios, take each ratio to a predetermined power and sum the products, average the ratios, determine a weighted average of the ratios, or the like to determine a single score for testing material 86. Control module 98 then may compare the single score to a threshold score value and determine that tested material 86 includes a crack or other defect if the single score is greater than the threshold score value.

As another example, in implementations in which electrical contacts 88 are positioned symmetrically about tested material 86 with reference to a symmetry of tested material 86, a set of drive electrical contacts may be positioned on the symmetry of tested material 86, e.g., on a plane of symmetry of tested material 86. A first measurement electrical contact and a second measurement electrical contact may be positioned symmetrically with reference to the symmetry of tested material 86, e.g., with reference to a plane of symmetry of tested material 86. In such an example, a first measured equivalent impedance determined using the first measurement electrical contact and a second measured equivalent impedance determined using the second measurement electrical contact are expected to be substantially the same (e.g., the same or nearly the same) in the absence of a crack or other defect in tested material 86. For example, in the absence of a crack or defect in tested material 86, the first equivalent impedance and the second equivalent impedance may be within a predetermined percentage of each other, such as, for example, within about 20%, 10%, 5%, or 1% of each other. Any difference between the first and second measured equivalent impedances that is greater than a threshold difference may indicate that tested material 86 includes a crack or other defect. The difference may be determined by subtracting the first measured equivalent impedance from the second measured equivalent impedance (or vice versa) or by determining a ratio between the first measured equivalent impedance and the second measured equivalent impedance (or vice versa).

As another example, in implementations in which electrical contacts 88 are positioned symmetrically about tested material 86 with reference to a symmetry of tested material 86, a first pair of drive electrical contacts and a second pair of drive electrical contacts may be different from each other. The first pair of drive electrical contacts and a first measurement electrical contact are a first group of electrical contacts and a second pair of drive electrical contacts and the second measurement electrical contact are a second group of electrical contacts. The first and second group of electrical contacts may be symmetric with each other relative to the symmetry of tested material 86, e.g., a plane of symmetry of tested material 86. As such, in the absence of a crack or other defect in tested material 86 the first measured equivalent impedance and the second measured equivalent impedance are expected be substantially the same (e.g., the same or nearly the same). Any difference between the first and second measured equivalent impedances that is greater than a threshold difference may indicate that tested material 86 includes a crack or other defect. The difference may be determined by subtracting the first measured equivalent impedance from the second measured equivalent impedance (or vice versa) or by determining a ratio between the first measured equivalent impedance and the second measured equivalent impedance (or vice versa).

As a further example, electrical contacts 88 may be positioned so that, for each group that includes a pair of drive electrical contacts and a measurement electrical contact, the measured equivalent impedance in the absence of a crack or other defect is substantially the same. The respective groups of electrical contacts may or may not be symmetric to another group of electrical contacts, and tested material 86 may or may not include a symmetry. As such, regardless of the groups of electrical contacts selected as the first group of electrical contacts and the second group of electrical contacts, in the absence of a crack or other defect in material 86 the first measured equivalent impedance and the second measured equivalent impedance may be substantially the same (e.g., the same or nearly the same). Any difference between measured equivalent impedances that is greater than a threshold difference may indicate that tested material 86 includes a crack or other defect. The difference may be determined by subtracting the first measured equivalent impedance from the second measured equivalent impedance (or vice versa) or by determining a ratio between the first measured equivalent impedance and the second measured equivalent impedance (or vice versa).

As an additional example, control module 98 may calculate an approximate impedance distribution within tested material 86 to determine whether tested material 86 includes a crack or other defect (204). In some examples, reconstruction of the impedance distribution may be achieved by minimizing the difference between the output of a physics-based simulation tool with the respective control voltages, and the respective measurement voltages. For example, control module 98 may be programmed with a finite element model (FEM) of tested material 86 which implements the physics-based simulation. The FEM of tested material 86 may include substantially accurate (e.g., accurate or approximately accurate) geometry of tested material 86 (e.g., the shape and volume of tested material 86), and also may include substantially accurate (e.g., accurate or approximately accurate) locations of electrical contacts 88 attached to tested material 86. In some examples, the FEM of tested material 86 may additionally include representative properties of tested material 86, including, for example, conductivity, resistivity, other related electrical properties, and the like. The FEM of tested material 86 may include representative properties of tested material 86 for each respective node representing tested material 86.

Calculating the approximate impedance distribution to determine whether tested material 86 includes a crack or other defect is an ill-posed inverse problem, in which the outputs (the respective measurement equivalent impedances) are known but the properties of tested material 86 that produce the outputs are unknown. Moreover, more than one set of properties of tested material 86 may produce the outputs. Hence, control module 98 may utilize a regularization technique to constrain the solution to solutions more likely to represent the properties of tested material 86 that would produce the respective measurement equivalent impedances.

In particular, control module 98 may generate an objective function which combines outputs of the physics-based model, respective control equivalent impedances, the respective measurement equivalent impedances, and the regularization term. For example:

$$\operatorname*{argmin}_{x}\left\{\mathcal{F}(x) := \frac{1}{2}\|f(x)-y\|_{\ell_2}^2 + \lambda \frac{1}{2}\|Rx\|_{\ell_2}^2\right\}$$

where x is the approximate change in impedance distribution, f is an operator calculating the simulated difference in equivalent impedances based on input x utilizing the physics-based simulation, y is the measured difference in equivalent impedances, $l_2$ is a chosen norm, R is the regularization matrix, and λ is the chosen weight of the regularization or regularization parameter. Control module 98 may determine respective model control equivalent impedances based on the physics-based model and inputs representative of the electrical signal(s) applied to the respective pairs of drive electrical contacts. The respective model control equivalent impedances may be associated with respective pairs of measurement electrical contacts for each respective pair of drive electrical contacts used to collect the control equivalent impedances from tested material 86. Control module 98 then may determine, using the physics-based model and inputs representative of the electrical signal(s) applied to the respective pairs of drive electrical contacts, respective model measurement equivalent impedances. The respective model measurement equivalent impedances may be associated with respective pairs of measurement electrical contacts for each respective pair of drive electrical contacts used to collect the measurement equivalent impedances from tested material 86. For each respective model measurement equivalent impedance, control module 98 may determine a respective difference between the respective model measurement equivalent impedance and the respective model control equivalent impedance (f(x) in the equation above).

Control module 98 also may determine a respective difference between the respective measurement equivalent impedance and the respective control equivalent impedance for each respective measurement equivalent impedance measured using tested material 86 to generate a set of actual equivalent impedance differences (y in the equation above).

Control module 98 then may minimize the objective function by updating one or more parameters of the physics-based model. Control module 98 may continue to iterate the model until a stopping criterion is reached. Control module 98 then may determine the approximate impedance distribution (or approximate change in impedance distribution) that is representative of the condition of tested material 86. When iteration completes the input to the model is the approximate impedance distribution.

Control module 98 may then determine whether tested material 86 includes a crack or other defect based on the approximate change in impedance distribution. For example, control module 98 may determine whether tested material 86 includes a crack or other defect based on the magnitude and location of the approximate impedance change within the material. In some examples, only the real portion of the impedance—the conductivity or resistivity—may be used by control module 98 to determine whether tested material 86 includes a crack or other defect.

In some examples, rather than utilizing respective control equivalent impedances and respective model control equivalent impedances, control module 98 may determine an approximate impedance distribution using an absolute form of the objective function, in which x is the impedance distribution, f is an operator calculating a set of the simulated equivalent impedances based on input x utilizing the physics-based simulation, y is a set of the measured equivalent impedances, $l_2$ is a chosen norm, R is the regularization matrix, and λ is the chosen weight of the regularization or regularization parameter.

In any of the techniques described herein, control module 98 may output an indication of the determination of whether tested material 86 includes a crack or other defect to user interface device 102 for output to a user. In some examples, the representation may include a simplified output, such as an indication of "Yes" or "No," "Crack" or "No Crack," "Damaged" or "Intact," or the like. The representation may be textual, icon-based, color-based, audible, haptic, or the like. For example, the representation may include a green light to represent that tested material 86 is still intact or a red light to represent that tested material 166 is damaged or includes a crack or other defect.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), ferroelectric RAM (FRAM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Clause 1: A measurement system comprising: a set of drive electrical contacts comprising a force electrical contact and a return electrical contact electrically coupled to a tested material; a measurement electrical contact electrically coupled to the tested material; a return node; a voltage source, wherein a circuit path between the voltage source and the return node comprises a fixed resistor and the tested material; and a control module. The control module may be configured to: cause the voltage source to apply a voltage signal to the force electrical contact; cause a voltage drop across the fixed resistor to be measured; cause a measured voltage to be measured using the measurement electrical contact; determine a measured equivalent impedance of the tested material associated with the measurement electrical contact based on the voltage drop across the fixed resistor and the measured voltage; and determine whether the tested material includes a crack or other defect based on the measured equivalent impedance.

Clause 2: The measurement system of clause 1, wherein the fixed resistor is electrically connected in series between the voltage source and the force electrical contact.

Clause 3: The measurement system of clause 1, wherein the fixed resistor is electrically connected in series between the return electrical contact and the return node.

Clause 4: The measurement system of any one of clauses 1 to 3, further comprising a set of N electrical contacts, wherein the set of N electrical contacts comprises the set of drive electrical contacts and the measurement electrical contact.

Clause 5: The measurement system of clause 4, further comprising a set of N fixed resistors, wherein: the set of N fixed resistors comprises the fixed resistor; and a respective resistor of the set of N resistors is electrically connected in series with each respective electrical contact of the set of N electrical contacts.

Clause 6: The measurement system of clause 5, wherein each respective fixed resistor of the set of N fixed resistors has a resistance within about 1% of a nominal resistance of the respective fixed resistor.

Clause 7: The measurement system of claim 5 or 6, further comprising a programmable switch array, wherein each electrical contact of the set of N electrical contacts is connected to at least one respective electrical contact input of the programmable switch array, and wherein the control module is configured to control the programmable switch array.

Clause 8: The measurement system of clause 7, further comprising a controller, wherein the controller comprises the control module and the programmable switch array.

Clause 9: The measurement system of clause 7 or 8, wherein: the programmable switch array comprises at least N electrical contact input ports, at least N resistor input ports, at least 4*N switches, and at least 2*N inputs; and for each respective electrical contact: the respective electrical contact is electrically connected to an electrical contact input port; and the respective electrical contact is electrically connected via a respective resistor from the set of N resistors to a resistor input port.

Clause 10: The measurement system of clause 9, further comprising an analog-to-digital converter (ADC), wherein: each respective electrical contact input port is electrically connected to a respective output port to the ADC via a respective switch; and each respective resistor input port is electrically connected via a respective set of switches to the voltage source, a return node, and the ADC.

Clause 11: The measurement system of clause 10, further comprising at least one digital-to-analog converter (DAC), wherein the at least one DAC is connected to the ADC, and wherein the control module is further configured to control the DAC to output a reference voltage to the ADC.

Clause 12: The measurement system of clause 10 or 11, further comprising a controller, wherein the controller comprises the control module, the programmable switch array, and the ADC.

Clause 13: The measurement system of any one of clauses 10 to 12, wherein the control module is further configured to: cause the programmable switch array to connect a first electrical contact from the set of N electrical contacts to the voltage source to operate as the force electrical contact; cause the programmable switch array to connect a second electrical contact from the set of N electrical contacts to the return node to operate as the return electrical contact; cause the voltage drop across the fixed resistor to be measured by at least causing the ADC to measure a voltage drop across the respective fixed resistor associated with the first electrical contact; cause the programmable switch array to connect a third electrical contact from the set of N electrical contacts to the ADC as the measurement electrical contact; cause the measured voltage to be measured using the measurement electrical contact by at least causing the ADC to measure the measured voltage associated with the third electrical contact.

Clause 14: The measurement system of clause 13, wherein the control module is further configured to cause the ADC to measure a voltage of the voltage signal output by the voltage source.

Clause 15: The measurement system of clause 13 or 14, wherein: the measurement electrical contact comprises a first measurement electrical contact and the equivalent impedance comprises a first equivalent impedance; and the control module is further configured to: cause the programmable switch array to connect a fourth electrical contact from the set of N electrical contacts to the ADC as a second measurement electrical contact; cause the ADC to measure a second measured voltage associated with the fourth electrical contact; determine a second equivalent impedance of the tested material associated with the second measurement electrical contact based on the voltage drop across the fixed resistor and the second measured voltage; and determine whether the tested material includes a crack or other defect based on the first equivalent impedance and the second equivalent impedance.

Clause 16: The measurement system of any one of clauses 1 to 15, further comprising the tested material, wherein the set of drive electrical contacts and the measurement electrical contact are electrically connected to the tested material.

Clause 17: The measurement system of any one of clauses 1 to 16, further comprising a nonvolatile memory device, wherein: the nonvolatile memory device stores a control equivalent impedance associated with the measurement electrical contact; and the control module is further configured to: retrieve the control equivalent impedance from the nonvolatile memory device; and determine whether the tested material includes the crack or other defect based on the measured equivalent impedance and the control equivalent impedance.

Clause 18: The measurement system of clause 17, wherein the control module is configured to determine whether the tested material includes the crack or other defect based on a ratio between the measured equivalent impedance and the control equivalent impedance or a difference between the measured equivalent impedance and the control equivalent impedance.

Clause 19: The measurement system of clause 4, wherein the set of N electrical contacts are arranged symmetrically on the tested material with reference to a symmetry of the tested material, wherein the symmetry is a point, a line, a plane, a curve, or a manifold, and wherein a single mathematical operation made with reference to the symmetry maps each electrical contact of the plurality of electrical contacts to another electrical contact of the plurality of electrical contacts.

Clause 20: The measurement system of any one of clauses 1 to 19, wherein the measured equivalent impedance is a measured equivalent resistance.

Clause 21: The measurement system of any one of clauses 1 to 20, further comprising the tested material, wherein the set of drive electrical contacts, the measurement electrical contact, the voltage source, and the control module are attached to the tested material.

Clause 22: The measurement system of any one of clauses 1 to 20, further comprising the tested material and a measurement device, wherein the set of drive electrical contacts and the measurement electrical contact are attached to the tested material, and wherein the measurement device comprises the voltage source and the control module.

Clause 23: The measurement system of any one of clauses 1 to 20, further comprising the tested material and a measurement device, wherein the control module is attached to the tested material and the measurement device comprises a voltage source.

Clause 24: A method comprising: causing, by a control module, a voltage source to apply a voltage signal to a force electrical contact of a set of drive electrical contacts, wherein the set of drive electrical contacts comprises the force electrical contact and a return electrical contact, wherein the force electrical contact and the return electrical contact are electrically coupled to a tested material, and wherein a circuit path between the voltage source and a return node comprises a fixed resistor and the tested material; causing, by the control module, a voltage drop across the fixed resistor to be measured; causing, by the control module, a measured voltage to be measured using a measurement electrical contact; determining, by the control module, a measured equivalent impedance of the tested material associated with the measurement electrical contact based on the voltage drop across the fixed resistor and the measured voltage; and determining, by the control module, whether the tested material includes a crack or other defect based on the measured equivalent impedance.

Clause 25: The method of clause 24, wherein the fixed resistor is electrically connected in series between the voltage source and the force electrical contact.

Clause 26: The method of clause 24, wherein the fixed resistor is electrically connected in series between the return electrical contact and a return node.

Clause 27: The method of any one of clauses 24 to 26, wherein a set of N electrical contacts comprises the set of drive electrical contacts and the measurement electrical contact.

Clause 28: The method of clause 27, wherein: a set of N fixed resistors comprises the fixed resistor; and a respective resistor of the set of N resistors is electrically connected in series with each respective electrical contact of the set of N electrical contacts.

Clause 29: The method of clause 28, wherein each respective fixed resistor of the set of N fixed resistor has a resistance within about 1% of a nominal resistance of the respective fixed resistor.

Clause 30: The method of clause 28 or 29, wherein each electrical contact of the set of N electrical contacts is connected to at least one respective electrical contact input of a programmable switch array, and wherein the control module is configured to control the programmable switch array.

Clause 31: The method of clause 30, wherein: the programmable switch array comprises at least N electrical contact input ports, at least N resistor input ports, at least 4*N switches, and at least 2*N inputs; and for each respective electrical contact: the respective electrical contact is electrically connected to an electrical contact input port; and the respective electrical contact is electrically connected via a respective resistor from the set of N resistors to a resistor input port.

Clause 32: The method of clause 31, wherein: each respective electrical contact input port is electrically connected to a respective output port to an analog-to-digital converter (ADC) via a respective switch; and each respective resistor input port is electrically connected via a respective set of switches to the voltage source, a return node, and the ADC.

Clause 33: The method of clause 32, further comprising causing, by the control module, at least one digital-to-analog converter (DAC) to output a reference voltage to the ADC.

Clause 34: The method of clause 32 or 33, further comprising: causing, by the control module, the programmable switch array to connect a first electrical contact from the set of N electrical contacts to the voltage source to operate as the force electrical contact; causing, by the control module, the programmable switch array to connect a second electrical contact from the set of N electrical contacts to the return node to operate as the return electrical contact; causing, by the control module, the ADC to measure a voltage drop across the respective fixed resistor associated with the first electrical contact; causing, by the control module, the programmable switch array to connect a third electrical contact from the set of N electrical contacts to the ADC as the measurement electrical contact; and causing, by the control module, the ADC to measure the measured voltage associated with the third electrical contact.

Clause 35: The method of clause 34, further comprising causing, by the control module, the ADC to measure a voltage of the voltage signal output by the voltage source.

Clause 36: The method of clause 34 or 35, wherein: the measurement electrical contact comprises a first measurement electrical contact and the equivalent impedance comprises a first equivalent impedance; and the method further comprises: causing, by the control module, the programmable switch array to connect a fourth electrical contact from the set of N electrical contacts to the ADC as a second measurement electrical contact; causing, by the control module, the ADC to measure a second measured voltage associated with the fourth electrical contact; determining, by the control module, a second equivalent impedance of the tested material associated with the second measurement electrical contact based on the voltage drop across the fixed resistor and the second measured voltage; and determining, by the control module, whether the tested material includes a crack or other defect based on the first equivalent impedance and the second equivalent impedance.

Clause 37: The method of any one of clauses 24 to 36, further comprising: retrieving, by the control module, a control equivalent impedance associated with the measurement electrical contact from a nonvolatile memory device; and wherein determining whether the tested material includes a crack or other defect comprises determining, by the control module, whether the tested material includes the crack or other defect based on the measured equivalent impedance and the control equivalent impedance.

Clause 38: The method of clause 37, wherein determining whether the tested material includes the crack or other defect based on the measured equivalent impedance and the control equivalent impedance comprises determining, by the control module, whether the tested material includes the crack or other defect based on a ratio between the measured equivalent impedance and the control equivalent impedance or a difference between the measured equivalent impedance and the control equivalent impedance.

EXAMPLES

Example 1

Figure 6:
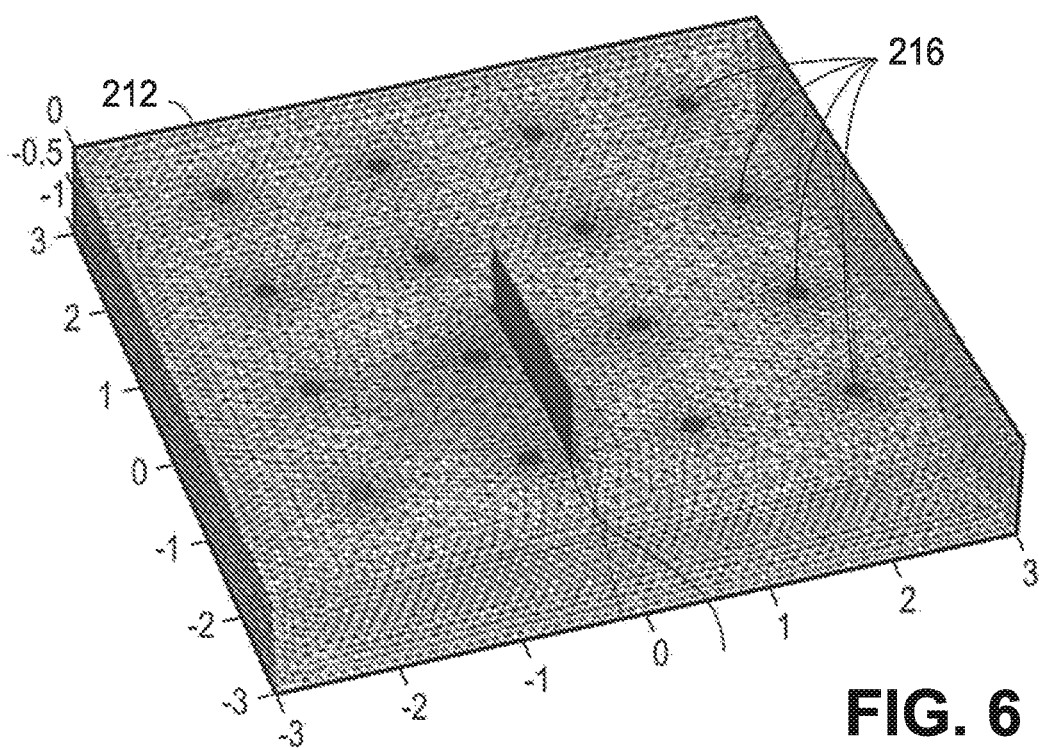
FIG. 6 is a diagram illustrating an example finite element model of a material that includes a simulated crack or other defect.

FIG. 6 is a diagram illustrating an example fine-grained FEM of a material 212 that includes a simulated crack or other defect. The fine-grained FEM includes a thin 'crack' feature 214 of low conductivity (compared to the rest of the sample) buried below the top surface of the sample and almost touching the bottom. FIG. 6 also illustrates a set of sixteen electrical contacts 216 distributed around the upper surface of material 212 (four of which are labeled in FIG. 6). A forward solution of electrical conductivity using this fine-grained FEM was used to generate the measured voltages for the cracked material. A forward solution of the same fine-grained FEM, but excluding the thin 'crack' feature 214 was used to generate the control voltages.

A coarse-grained FEM, having a coarser mesh than the fine-grained FEM, was used to reconstruct the fine-grained FEM including the crack. The electrical contact placement and geometry of the coarse-grained FEM was the same as in the fine-grained FEM. The algorithm inv_solve_diff_GN_one_step in the package Electrical Impedance Tomography and Diffuse Optical Tomography Reconstruction Software (EIDORS) was used to solve the reconstruction problem in MATLAB®. MATLAB® is available from MathWorks®, Inc., Natick, Mass., United States. EIDORS is available at eidors3d.sourceforge.net. An L-Curve method of hyperparameter selection and a Laplace filter penalty function was utilized in the EIDORS package.

Figure 7:
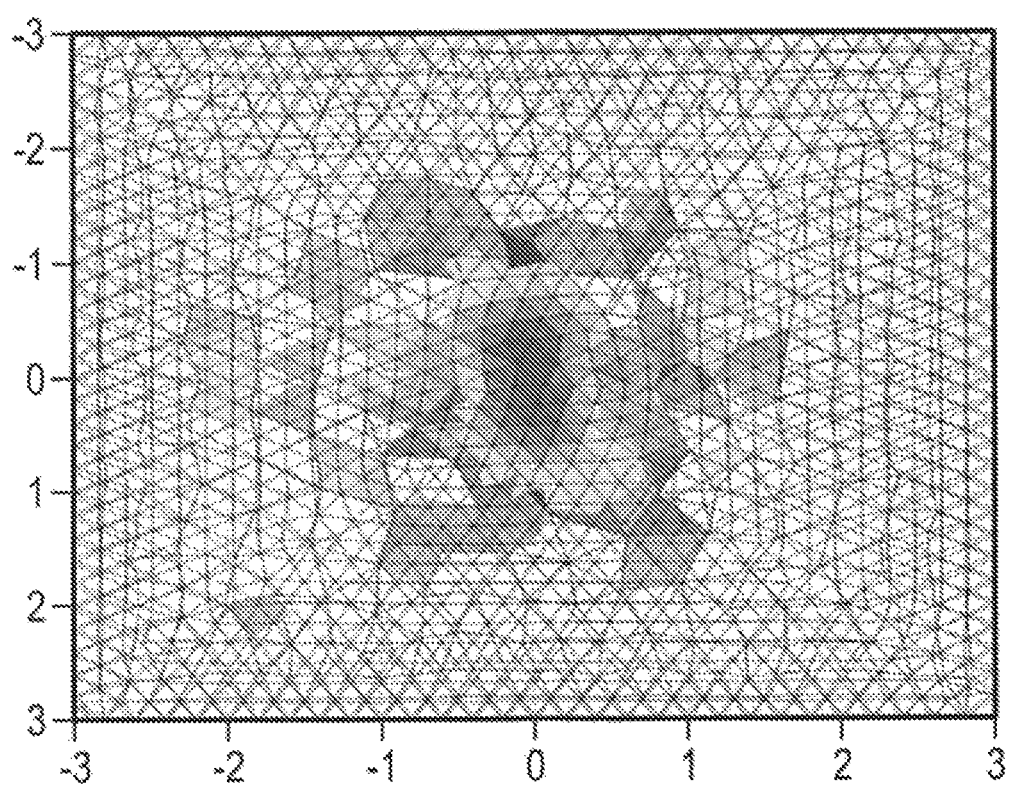
FIG. 7 is a diagram illustrating an example gray scale model output overlaid on an example finite element model of a material that includes a simulated crack or other defect.
Figure 8:
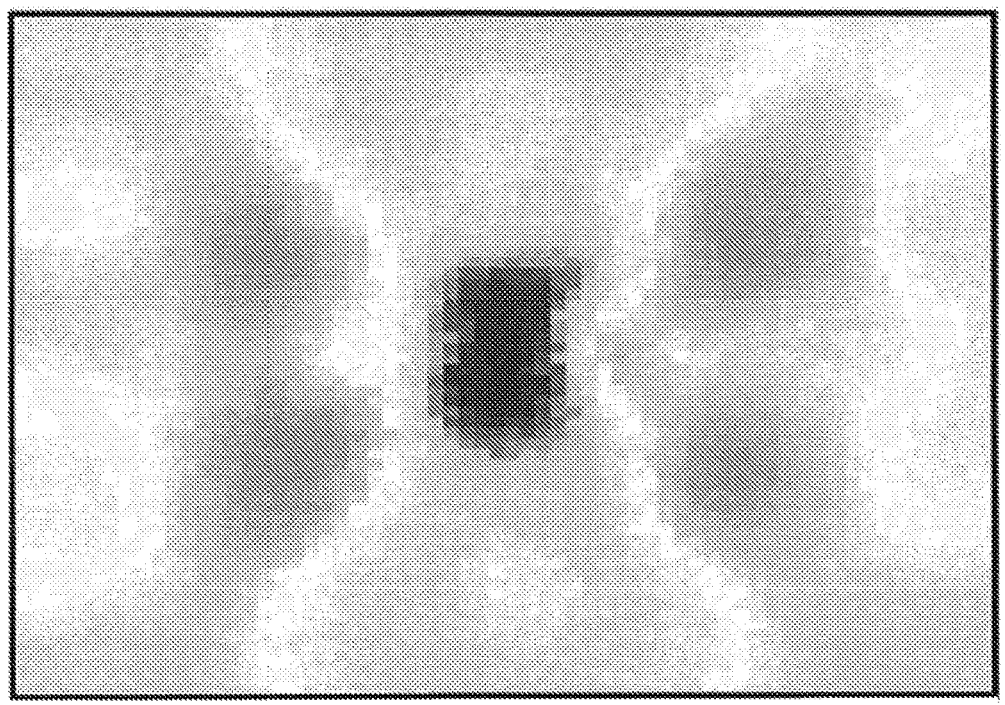
FIG. 8 is a diagram illustrating an example gray scale output of a finite element model of a material that includes a simulated crack or other defect.

FIG. 7 is a diagram illustrating an example gray scale model output overlaid on an example finite element model of a material that includes a simulated crack or other defect. The image shown in FIG. 7 is an output of the coarse-grained FEM with the physics-based model after solving the regularized least-squares minimization problem. The image shown in FIG. 7 is shown looking up at the bottom of the model. The defect is clearly detected in the sample in the center of the image. Cross-sectional images can be taken at any location within the model. FIG. 8 is a cross-sectional diagram illustrating an example gray scale output of a FEM that includes a simulated crack or other defect. This example utilized only one iteration of the Gauss-Newton algorithm and exhibits some noise surrounding the simulated crack. These artifacts can be reduced by running multiple iterations to refine the solution further (at the cost of computation time, for example between 2 and 20 iterations could be used).

Example 2

Figure 9:
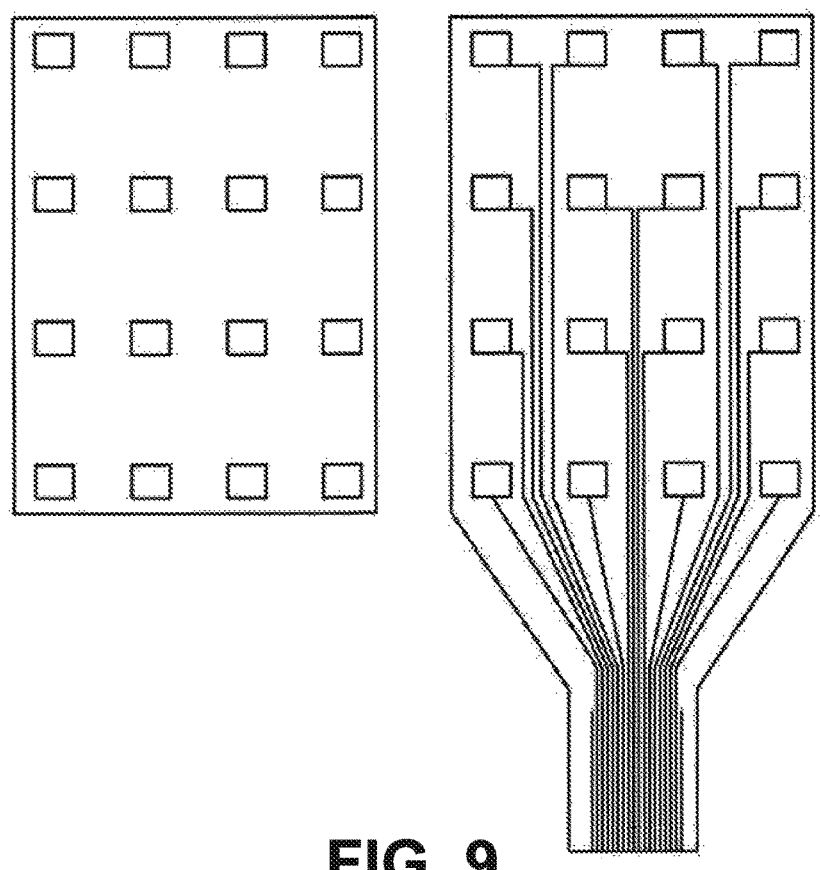
FIG. 9 is a drawing illustrating an example ceramic sample including a sixteen element electrical contact array and a flex circuit.
Figure 10:
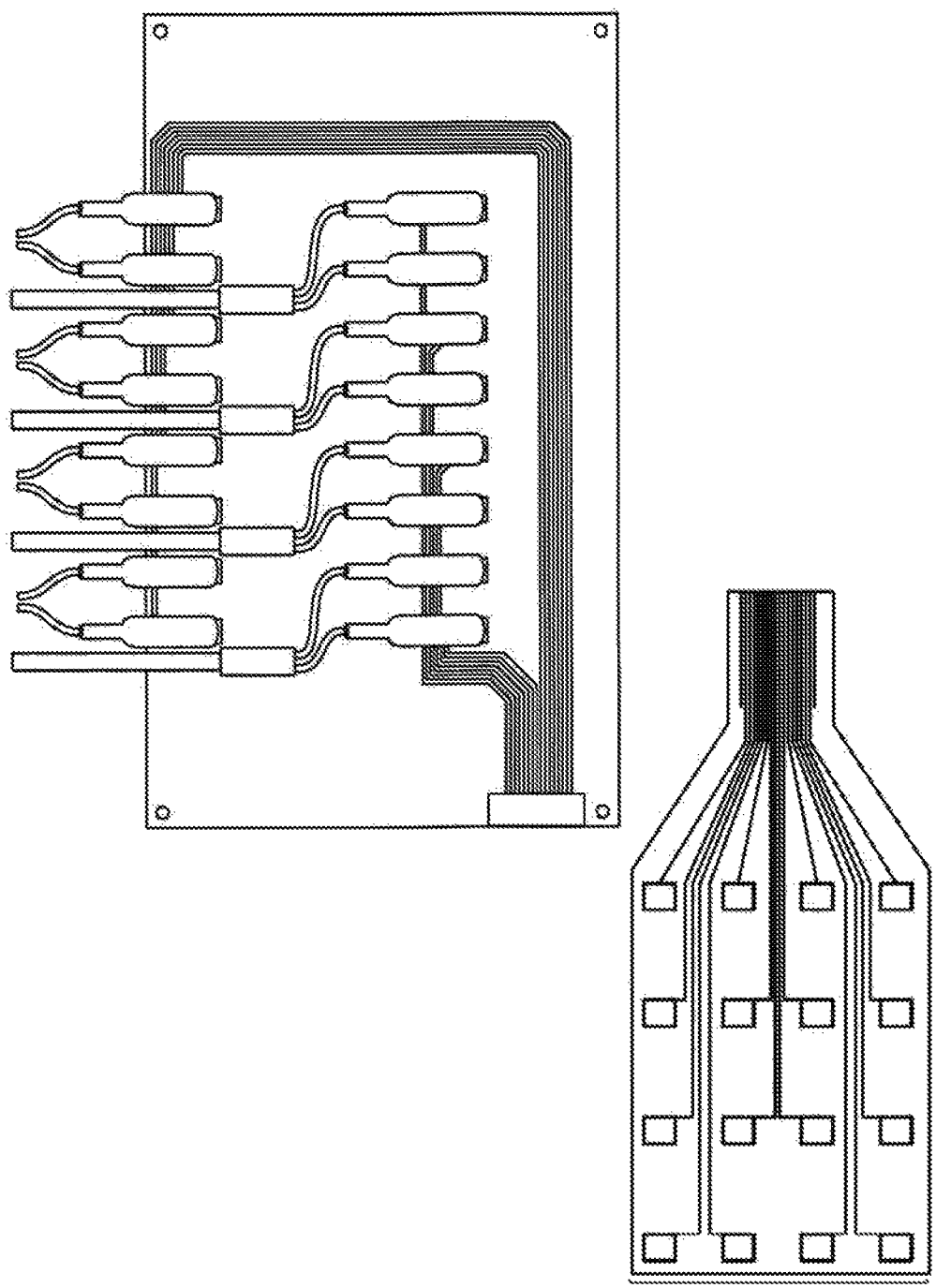
FIG. 10 is a drawing illustrating the example ceramic sample of FIG. 9 attached to a flex circuit, a breakout board, and a set of leads.

A ceramic sample included approximately 70% boron carbide and 30% silicon carbide. The back side of the ceramic sample was coated with a fiberglass/epoxy resin to keep the pieces in intimate contact after breaking. On the front side, sixteen approximately square electrical contacts were vapor deposited through a shadow mask. The electrical contacts included a first layer of titanium with a thickness of about 5 nanometers (nm) and a second layer of gold with a thickness of about 100 nm. A flex circuit was etched to match the locations of the electrical contacts, and a conductive silver-loaded epoxy was used to make electrical connections between the flex circuit and gold contacts. The flex circuit then was connected to a breakout board, which was connected to the switch matrixes. After the conductive epoxy was cured and the flex circuit attached to the electrical contacts, the ceramic sample was wrapped in tape to help further contain any pieces after breaking. FIG. 9 is a drawing illustrating the ceramic sample including the sixteen element electrical contact array and the flex circuit. FIG. 10 is a drawing illustrating an example ceramic material attached to a flex circuit, a breakout board, and a set of leads.

AC currents of 10 mA were applied to pairs of electrical contacts. Electrical contacts were numbered 1-16 and drive pairs were six electrical contacts apart (e.g. 1 and 7, 2 and 9, etc.) using modulo 16 math. Measurement pairs were adjacent (e.g. 1 and 2) again modulo 16. For each drive pair, all possible measurements were taken according to the following rule: the measurement pairs may not contain either drive electrical contact. Frequencies of 50 kHz, 100 kHz, and 150 kHz were used.

Figure 11:
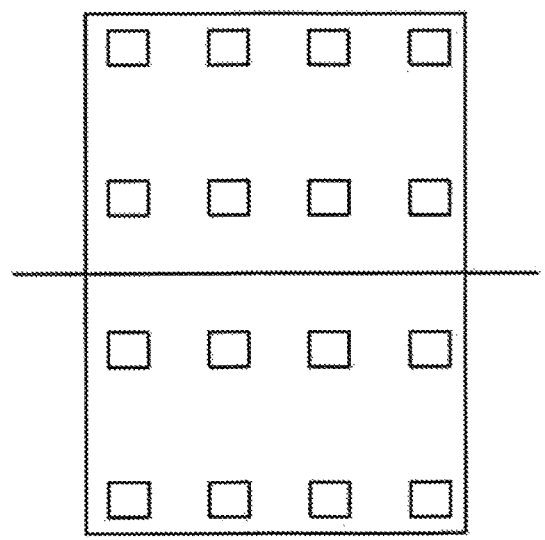
FIG. 11 is a drawing illustrating the example ceramic sample of FIG. 9 including an electrical contact array and a location of a crack.

A control dataset was taken prior to breaking the ceramic sample. After the initial dataset was taken, the sample was hit in approximately the center with a hammer, resulting in a crack located through the middle of the ceramic sample. FIG. 11 is a drawing illustrating the ceramic sample including an electrical contact array and the location of a crack. FIG. 11 illustrates the location of the crack as the horizontal line through the approximate center of the ceramic sample.

After breaking, a measurement data set was collected according to the rules described above. The control dataset and measurement data set were analyzed using electrical impedance tomography image reconstruction algorithms. In particular, the algorithm inv_solve_diff_GN_one_step in the package EIDORS was used to determine the approximate impedance change within the sample. MATLAB® is available from MathWorks®, Inc., Natick, Mass., United States. EIDORS is available at eidors3d.sourceforge.net. An L-Curve method of hyperparameter selection and a Laplace filter penalty function was utilized in the EIDORS package.

Figure 12:
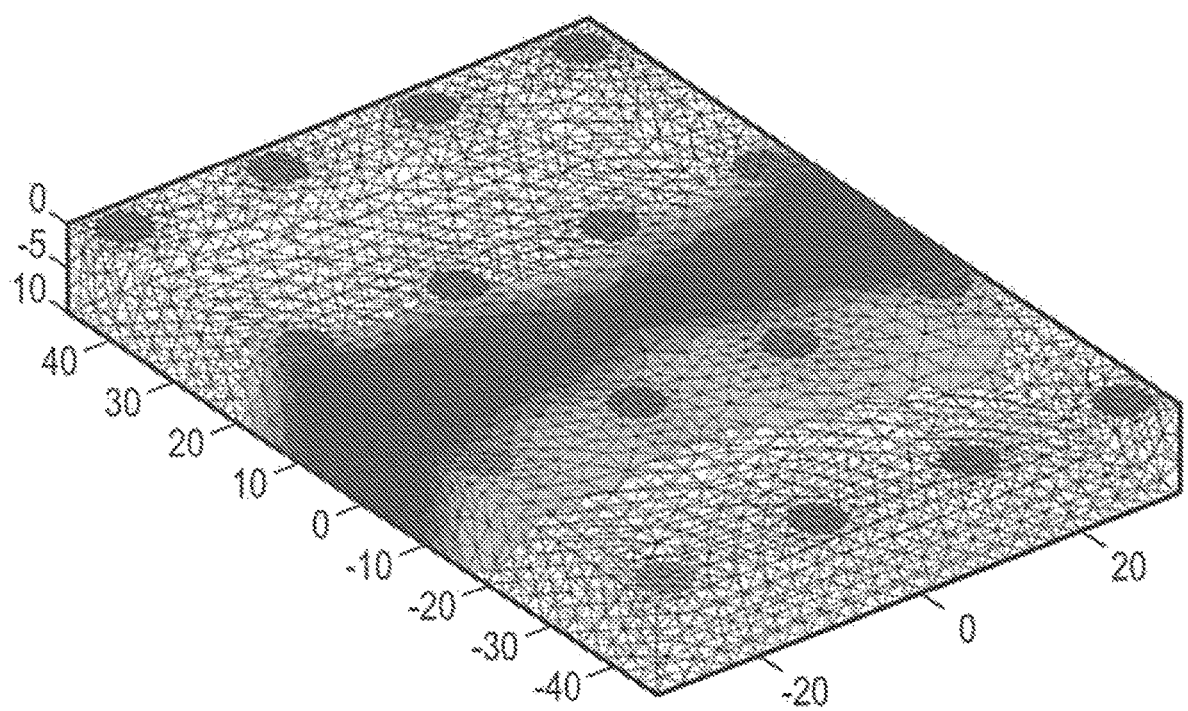
FIG. 12 is a diagram illustrating an example gray scale output of the EIDORS algorithm for the example ceramic sample of FIG. 11.

FIG. 12 is a diagram illustrating an example gray scale output of the EIDORS algorithm for the example ceramic sample of FIG. 11. The crack creates a region of higher resistance, and this is shown in the figure below as a drop in conductivity (darker shading indicates lower conductivity than the initial dataset).

Various examples have been described. These and other examples are within the scope of the following claims.

What is claimed is:

1. A measurement system comprising:
a set of electrical contacts electrically coupled to a tested material, the set of electrical contacts comprising a set of drive electrical contacts comprising:

a force electrical contact;
a return electrical contact; and
a measurement electrical contact, wherein the set of electrical contacts forms an electrical connection between a return node and a voltage source, the electrical connection comprising an in-series connection with the force electrical contact, a fixed resistor, the tested material, and the return electrical contact; and a control module
configured to:
cause the voltage source to apply a voltage signal to the tested material via the force electrical contact;
measure a voltage drop across the fixed resistor;
determine, at the measurement electrical contact, a measured voltage relative to a reference voltage;
determine a first measured equivalent impedance of the tested material associated with the measurement electrical contact based on the voltage drop across the fixed resistor and the measured voltage; and
determine whether the tested material includes a crack or other defect based on the first measured equivalent impedance and a second equivalent impedance selected from the group consisting of a second measured equivalent impedance, and iii) a control equivalent impedance.

2. The measurement system of claim 1, wherein the fixed resistor is electrically connected in series between the voltage source and the force electrical contact.

3. The measurement system of claim 1, wherein the fixed resistor is electrically connected in series between the return electrical contact and the return node.

4. The measurement system of claim 1, further comprising a set of N electrical contacts, wherein the set of N electrical contacts comprises the set of electrical contacts and the measurement electrical contact.

5. The measurement system of claim 4, further comprising a set of N fixed resistors, wherein the set of N fixed resistors comprises the fixed resistor, and wherein a respective resistor of the set of N resistors is electrically connected in series with each respective electrical contact of the set of N electrical contacts.

6. The measurement system of claim 5, further comprising a programmable switch array comprising one or more electrical contact inputs, wherein each electrical contact of the set of N electrical contacts is connected to at least one respective electrical contact input of the programmable switch array, and wherein the control module is configured to control the programmable switch array.

7. The measurement system of claim 6, wherein the programmable switch array further comprises at least N electrical contact input ports, at least N resistor input ports, at least 4*N switches, and at least 2*N inputs, and
wherein, for each respective electrical contact:
the respective electrical contact is electrically connected to a respective electrical contact input port of the at least N electrical contact input ports; and
the respective electrical contact is electrically connected via a respective resistor from the set of N resistors to a respective resistor input port of the at least N resistor input ports.

8. The measurement system of claim 7, further comprising an analog-to-digital converter (ADC), wherein each respective electrical contact input port of the at least N electrical contact input ports is electrically connected to a respective output port to the ADC via a respective switch, and wherein each respective resistor input port of the at least N resistor input ports is electrically connected via a respective set of switches to the voltage source, a return node, and the ADC.

9. The measurement system of claim 8, further comprising at least one digital-to-analog converter (DAC), wherein the at least one DAC is connected to the ADC, and wherein the control module is further configured to control the DAC to output a reference voltage to the ADC.

10. The measurement system of claim 8, wherein the control module is further configured to:
cause the programmable switch array to connect a first electrical contact from the set of N electrical contacts to the voltage source to operate as the force electrical contact;
cause the programmable switch array to connect a second electrical contact from the set of N electrical contacts to the return node to operate as the return electrical contact;
cause the voltage drop across the fixed resistor to be measured by at least causing the ADC to measure a voltage drop across the respective fixed resistor associated with the first electrical contact;
cause the programmable switch array to connect a third electrical contact from the set of N electrical contacts to the ADC as the measurement electrical contact; and
cause the measured voltage to be measured using the measurement electrical contact by at least causing the ADC to measure the measured voltage associated with the third electrical contact.

11. The measurement system of claim 10, wherein the control module is further configured to cause the ADC to measure a voltage of the voltage signal output by the voltage source.

12. The measurement system of claim 10, wherein the measurement electrical contact comprises a first measurement electrical contact and the measured equivalent impedance comprises a first measured equivalent impedance, and wherein the control module is further configured to:
cause the programmable switch array to connect a fourth electrical contact from the set of N electrical contacts to the ADC as a second measurement electrical contact;
cause the ADC to measure a second measured voltage associated with the fourth electrical contact; and
determine the second measured equivalent impedance of the tested material associated with the second measurement electrical contact based on the voltage drop across the fixed resistor and the second measured voltage,
wherein to determine whether the tested material includes the defect, the control module is configured to determine whether the tested material includes the defect based on the first measured equivalent impedance and the second measured equivalent impedance.

13. The measurement system of claim 4, wherein the electrical contacts of the set of N electrical contacts are arranged symmetrically on the tested material with reference to a symmetry of the tested material, wherein the symmetry is a point, a line, a plane, a curve, or a manifold, and wherein a single mathematical operation made with reference to the symmetry maps each electrical contact of the plurality of electrical contacts to another electrical contact of the plurality of electrical contacts.

14. The measurement system of claim 1, further comprising a nonvolatile memory device configured to store the control equivalent impedance associated with the measurement electrical contact, wherein the control module is further configured to:

retrieve the control equivalent impedance from the non-volatile memory device; and determine whether the tested material includes the defect based on the measured equivalent impedance and the control equivalent impedance.

15. The measurement system of claim 14, wherein to determine whether the tested material includes the defect, the control module is configured determine whether the tested material includes the defect based on at least one of (i) a ratio between the measured equivalent impedance and the control equivalent impedance or (ii) a difference between the measured equivalent impedance and the control equivalent impedance.

16. The measurement system of claim 1, further comprising the tested material, wherein the set of drive electrical contacts and the measurement electrical contact are electrically connected to the tested material, and wherein the tested material comprises at least one of an electrically conductive ceramic, or a semiconductive ceramic.

17. The measurement system of claim 1, further comprising the tested material, wherein the set of drive electrical contacts, the measurement electrical contact, the voltage source, and the control module are attached to the tested material.

18. The measurement system of claim 1, wherein the defect comprises a crack in the tested material.

* * * * *

UNITED STATES PATENT AND TRADEMARK OFFICE
CERTIFICATE OF CORRECTION

PATENT NO. : 11,105,762 B2
APPLICATION NO. : 16/469955
DATED : August 31, 2021
INVENTOR(S) : Christopher Yungers Page 1 of 1

It is certified that error appears in the above-identified patent and that said Letters Patent is hereby corrected as shown below:

In the Claims

Column 35
Line 24, In Claim 1, before "a second", insert -- (i) --.
Line 25, In Claim 1, delete "(iii)" and insert -- (ii) --, therefor.

Column 37
Line 8, In Claim 15, before "determine", insert -- to --.

Signed and Sealed this
Twenty-sixth Day of April, 2022

Katherine Kelly Vidal
*Director of the United States Patent and Trademark Office*